US012812935B2

(12) United States Patent
Kim et al.

(10) Patent No.: US 12,812,935 B2

(45) Date of Patent: Nov. 24, 2026

(54) SEMICONDUCTOR DEVICE

(71) Applicant: Samsung Electronics Co., Ltd., Suwon-si (KR)

(72) Inventors: Kyungho Kim, Suwon-si (KR); Myungil Kang, Suwon-si (KR); Kyunghee Cho, Suwon-si (KR); Doyoung Choi, Suwon-si (KR); Donghoon Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 410 days.

(21) Appl. No.: 18/482,154

(22) Filed: Oct. 6, 2023

(65) Prior Publication Data

US 2024/0145544 A1 May 2, 2024

(30) Foreign Application Priority Data

Oct. 26, 2022 (KR) ........................ 10-2022-0138920

(51) Int. Cl.

*H10D 62/10* (2025.01)

*H10B 10/00* (2023.01)

(Continued)

(52) U.S. Cl.

CPC ......... *H10D 62/121* (2025.01); *H10B 10/125* (2023.02); *H10D 30/43* (2025.01); (Continued)

(58) Field of Classification Search

CPC .. H10D 62/121; H10D 30/43; H10D 30/6729; H10D 30/6733; H10D 30/6735; H10D 30/6757; H10D 62/151; H10D 64/258; H10D 30/014; H10D 62/124; H10D 62/235; H10D 64/512; H10D 30/60; H10D 30/62; H10D 30/6713; H10D 84/856; H10B 10/125; H10B 10/12; Y10S 257/903

See application file for complete search history.

(56) References Cited

U.S. PATENT DOCUMENTS

| | | | | |
|---|---|---|---|---|
| 10,192,819 | B1 * | 1/2019 | Chanemougame | ... H01L 23/485 |
| 11,158,544 | B2 | 10/2021 | Cheng et al. | |

(Continued)

FOREIGN PATENT DOCUMENTS

| | | | |
|---|---|---|---|
| KR | 10-2020-0025538 | A | 3/2020 |
| KR | 10-2022-0124327 | A | 9/2022 |

*Primary Examiner* — Jonathan Han

(74) *Attorney, Agent, or Firm* — Wolf, Greenfield & Sacks, P.C.

(57) ABSTRACT

A semiconductor device includes an active pattern extending in a first direction; a plurality of channel layers spaced apart from each other on the active pattern in a vertical direction and including lower channel layers and upper channel layers; an intermediate insulating layer between an uppermost lower channel layer and a lowermost upper channel layer; a gate structure intersecting the active pattern and the plurality of channel layers, and extending in a second direction intersecting the first direction; a lower source/drain region on a first side of the gate structure and connected to the lower channel layers; a blocking structure on a second side of the gate structure and connected to the lower channel layers; and an upper source/drain region on at least one side of the gate structure.

19 Claims, 30 Drawing Sheets

(51) Int. Cl.

| | |
|---|---|
| ***H10D 30/43*** | (2025.01) |
| ***H10D 30/67*** | (2025.01) |
| ***H10D 62/13*** | (2025.01) |
| ***H10D 64/23*** | (2025.01) |

(52) U.S. Cl.
CPC ..... *H10D 30/6729* (2025.01); *H10D 30/6733* (2025.01); *H10D 30/6735* (2025.01); *H10D 30/6757* (2025.01); *H10D 62/151* (2025.01); *H10D 64/258* (2025.01)

(56) References Cited

U.S. PATENT DOCUMENTS

| | | | | |
|---|---|---|---|---|
| 11,164,793 | B2 | 11/2021 | Xie et al. | |
| 11,177,258 | B2 | 11/2021 | Xie et al. | |
| 11,201,153 | B2 | 12/2021 | Xie et al. | |
| 2017/0162584 | A1 | 6/2017 | Pranatharthiharan et al. | |
| 2019/0319095 | A1 | 10/2019 | Zhang et al. | |
| 2020/0075331 | A1* | 3/2020 | Noh | H10D 64/017 |
| 2020/0098756 | A1 | 3/2020 | Lilak et al. | |
| 2020/0098859 | A1 | 3/2020 | Reboh et al. | |
| 2022/0020646 | A1 | 1/2022 | Lin et al. | |
| 2022/0109047 | A1 | 4/2022 | Jun et al. | |
| 2022/0123023 | A1* | 4/2022 | Peng | H10D 86/441 |
| 2024/0130142 | A1* | 4/2024 | Sung | H10B 63/80 |

* cited by examiner

SEMICONDUCTOR DEVICE

CROSS-REFERENCE TO RELATED APPLICATION(S)

This application claims benefit of priority to Korean Patent Application No. 10-2022-0138920 filed on Oct. 26, 2022, in the Korean Intellectual Property Office, the disclosure of which is incorporated herein by reference in its entirety.

FIELD

Example embodiments of the present disclosure relate to a semiconductor device and a method of manufacturing the same.

BACKGROUND

As demand for high performance, high speed, and/or multifunctionality of a semiconductor device has increased, integration density of a semiconductor device has increased. To overcome limitations in operating properties due to reduction of a size of planar metal oxide semiconductor (FET), there have been attempts to develop semiconductor devices such as FinFETs including fin-type channels and gate-all-around type field effect transistors including nanosheets surrounded by a gate.

SUMMARY

An example embodiment of the present disclosure is to provide a semiconductor device having improved electrical properties and reliability.

According to an example embodiment of the present disclosure, a semiconductor device includes an active pattern extending in a first direction on a substrate; a plurality of channel layers spaced apart from each other on the active pattern in a direction perpendicular to an upper surface of the substrate and including lower channel layers and upper channel layers on the lower channel layers; an intermediate insulating layer between an uppermost lower channel layer among the lower channel layers and a lowermost upper channel layer among the upper channel layers; a gate structure intersecting the active pattern and extending in a second direction intersecting the first direction and on the plurality of channel layers; a lower source/drain region on a first side of the gate structure and connected to the lower channel layers; a blocking structure on a second side of the gate structure and connected to the lower channel layers; and an upper source/drain region on at least one of the first side or the second side of the gate structure and connected to the upper channel layers.

According to an example embodiment of the present disclosure, a semiconductor device includes an active pattern extending in a first direction on a substrate; first lower channel layers on a first region of the active pattern and spaced apart from each other in a direction perpendicular to an upper surface of the substrate; second lower channel layers on a second region of the active pattern and spaced apart from each other in the direction perpendicular to the upper surface of the substrate; third lower channel layers on a third region of the active pattern and spaced apart from each other in the direction perpendicular to the upper surface of the substrate; first, second, and third intermediate insulating layers on uppermost lower channel layers of the first, second, and third lower channel layers, respectively; a plurality of first, second, and third upper channel layers stacked and spaced apart from each other on the first, second, and third intermediate insulating layers, respectively; a first gate structure intersecting the active pattern, extending in a second direction intersecting the first direction and on the first lower channel layers and the first upper channel layers; a second gate structure intersecting the active pattern, extending in the second direction and on the second lower channel layers and the second upper channel layers; a third gate structure intersecting the active pattern, extending in the second direction and on the third lower channel layers and the third upper channel layers; a first lower source/drain region between the first and second gate structures and connected to the first and second lower channel layers; a first upper source/drain region between the first and second gate structures and connected to the first and second upper channel layers; and a blocking structure between the second and third gate structures, where the blocking structure is between the second and third lower channel layers and/or is between the second and third upper channel layers.

According to an example embodiment of the present disclosure, a semiconductor device includes a first transistor structure on a substrate; and a second transistor structure on the first transistor structure, wherein the first transistor structure includes first channel layers stacked and spaced apart from each other on the substrate in a vertical direction perpendicular to an upper surface of the substrate; a first gate electrode on the first channel layers; a first source/drain region on a first side of the first gate electrode and connected to first side surfaces of the first channel layers; and a blocking structure covering the first channel layers on a second side of the first gate electrode, wherein the second transistor structure includes second channel layers on the first channel layers and stacked and spaced apart from each other in the vertical direction; a second gate electrode on the second channel layers; first and second upper source/drain regions on first and second sides of the second gate electrode and connected to opposing side surfaces of the second channel layers, respectively.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION OF EMBODIMENTS

Figure 1:
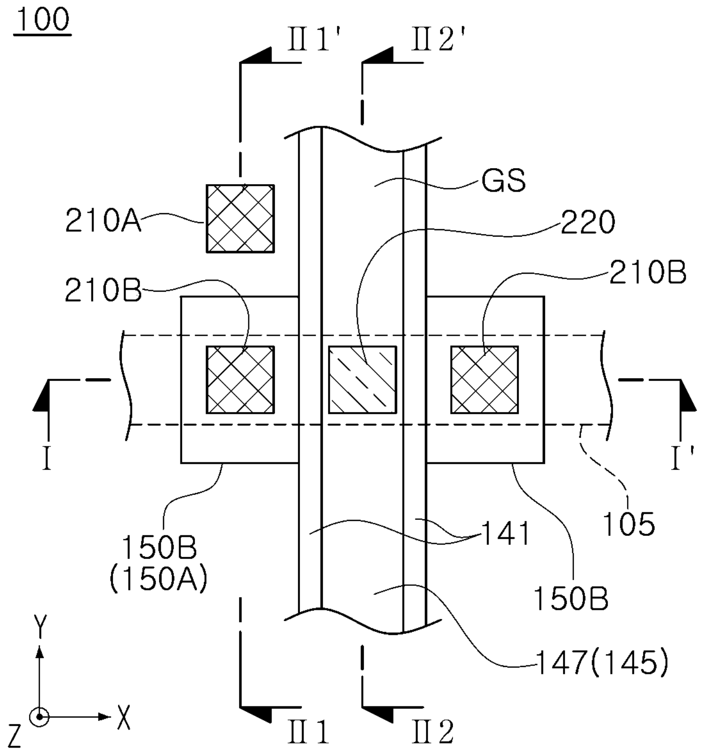
FIG. 1 is a plan diagram illustrating a semiconductor device according to an example embodiment of the present disclosure.
Figure 2:
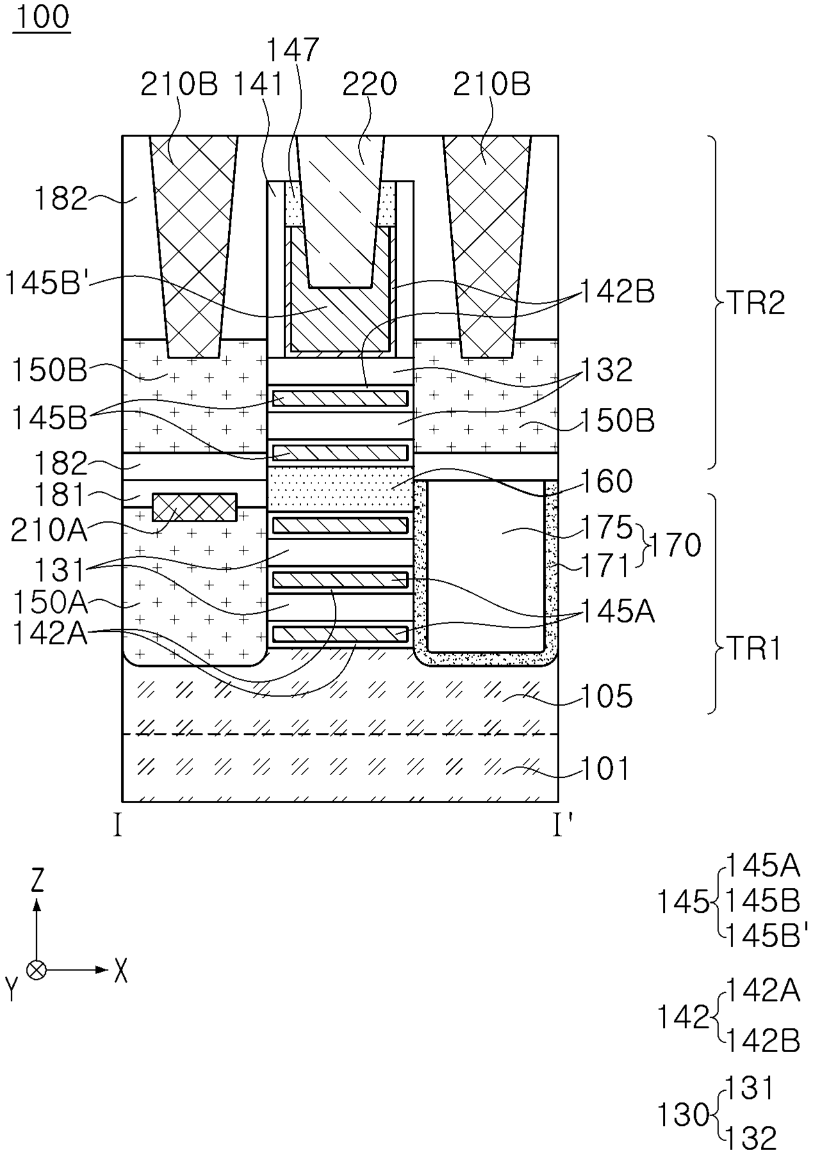
FIG. 2 is a cross-sectional diagram taken along line I-I' of FIG. 1.
Figure 3A:
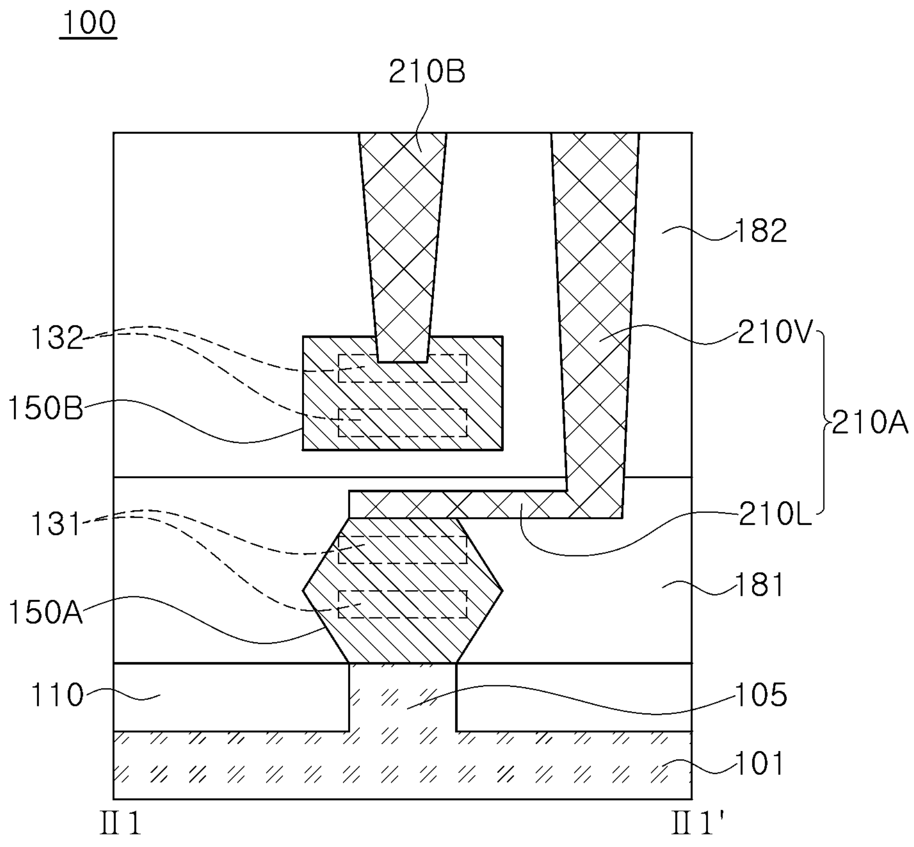
FIGS. 3A and 3B are cross-sectional diagrams illustrating the semiconductor device illustrated in FIG. 1 taken along lines II1-II1' and II2-II2' of FIG. 1.
Figure 3B:
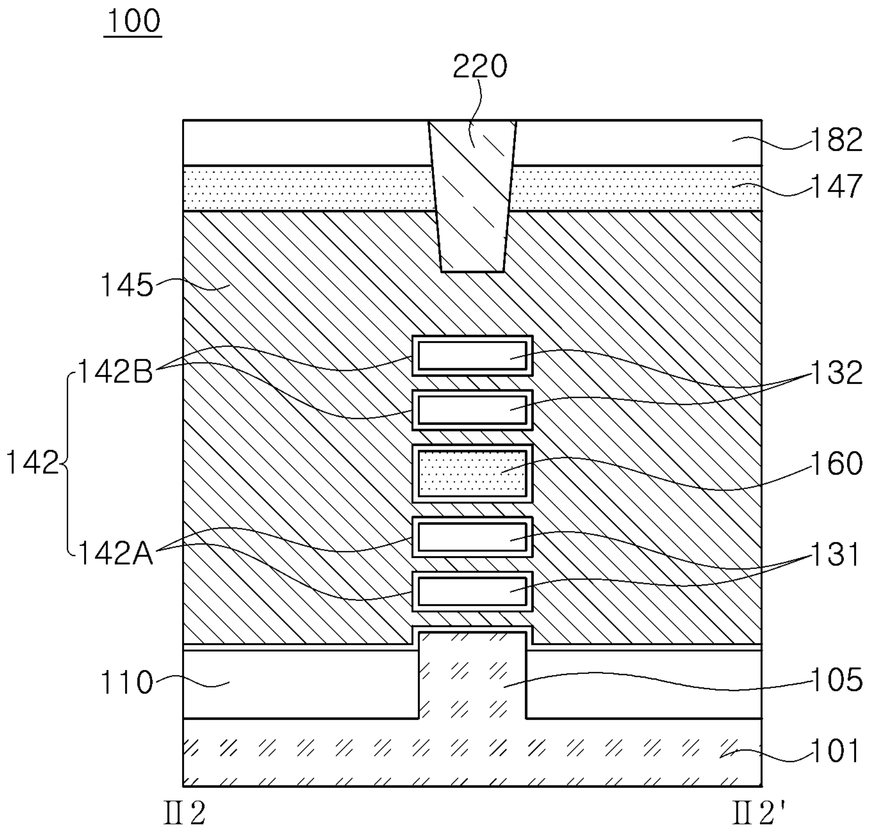

Hereinafter, embodiments of the present disclosure will be described as follows with reference to the accompanying drawings. The terms "comprises," "comprising," "includes" and/or "including," when used herein, specify the presence of stated elements, but do not preclude the presence of additional elements. The term "and/or" includes any and all combinations of one or more of the associated listed items FIG. 1 is a plan diagram illustrating a semiconductor device according to an example embodiment. FIG. 2 is a cross-sectional diagram taken along line I-I' in FIG. 1. FIGS. 3A and 3B are cross-sectional diagrams illustrating the semiconductor device illustrated in FIG. 1 taken along line II1-II1' and II2-II2'.

Referring to FIGS. 1, 2, 3A and 3B, the semiconductor device 100 may include a substrate 101 having an active pattern 105, a first transistor structure TR1 on the substrate 101, and a second transistor structure TR2 on the first transistor structure TR1. The terms "first," "second," etc., may be used herein merely to distinguish one component, layer, direction, etc. from another.

The substrate 101 may include a semiconductor material, for example, a group IV semiconductor, a group III-V compound semiconductor, or a group II-VI compound semiconductor. For example, the group IV semiconductor may include silicon (Si), germanium (Ge), or silicon germanium (SiGe). The substrate 101 may include a bulk wafer, an epitaxial layer, or a silicon on insulator (SOI) layer.

First and second transistor structures TR1 and TR2 may be stacked on the upper surface of the substrate 101 in a vertical direction (e.g., Z direction). The first and second transistor structures TR1 and TR2 may be configured as an N-type MOSFET and a P-type MOSFET, or a P-type MOSFET and an N-type MOSFET, respectively. The first and second transistor structures TR1 and TR2 employed in the example embodiment may be configured as a multibridge channel FET (MBCFET™) including a plurality of channel layers 130 disposed on the active pattern 105 and a gate structure GS surrounding the plurality of channel layers.

As illustrated in FIG. 1, the active pattern 105 may have a fin-type structure extending from the substrate 101 in a first direction (e.g., an X direction). As illustrated in FIGS. 3A and 3B, the device isolation film 110 may define an active pattern 105 on the substrate 101. The device isolation film 110 may be disposed on the substrate 101, and a portion of an active pattern 115 may protrude from an upper surface of the device isolation film 110. The device isolation film 110 may be formed by, for example, a shallow trench isolation (STI) process. The device isolation film 110 may include an insulating material. For example, the device isolation film 110 may include, for example, silicon oxide, silicon nitride, silicon oxynitride, or a combination thereof.

Referring to FIGS. 2, 3A and 3B, the first transistor structure TR1 may include first channel layers 131 (also referred to as "lower channel layer") stacked on the active pattern 105, a first gate electrode 145A surrounding the first channel layers 131, a first source/drain region 150A (also referred to as "lower source/drain region") connected to the first channel layers 131 on one side of the first gate electrode 145A, and a first gate insulating film 142A between the first channel layers 131 and the first gate electrode 145A. The term "connected to" may be used herein to refer to a physical and/or electrical connection. When components or layers are referred to as "directly on" or "directly connected", no intervening components or layers are present.

The first channel layers 131 may be stacked and spaced apart from each other in the vertical direction (e.g., Z direction) on the active pattern 105. A plurality of the first channel layers 131 (e.g., two or three first channel layers 131) may be provided, and each of the first channel layers may include a semiconductor pattern. For example, the first channel layers 131 may include at least one of silicon (Si), silicon germanium (SiGe), and germanium (Ge). The first gate electrode 145A may extend in a second direction (e.g., Y direction) intersecting the first direction (e.g., X direction). The first source/drain region 150A may be disposed in a recessed portion of the active pattern 105 on one side of the first channel layers 131. In example embodiments, the presence or absence of the recess and the depth of the recess may be varied.

The first transistor structure TR1 employed in the example embodiment may include a blocking structure 170 connected to the first channel layers 131 on the other side of the first gate electrode 145A. Similarly to the first source/drain region 150A, the blocking structure 170 may be disposed on the recessed portion of the active pattern 105 on the other side of the first gate electrode 145A.

In the example embodiment, the blocking structure 170 may be provided on the other side of the first gate electrode 145A instead of an epitaxial structure for a source/drain region. Specifically, by forming at least a portion of the blocking structure 170 in advance on the other side of the first gate electrode 145A before the epitaxial growth process for the first source/drain region 150A (see FIGS. 121 and 14C) and covering the other side surfaces of the first channel layer 131 provided as seed layers and the surface of the active pattern 105, epitaxial growth may be prevented (see FIG. 12J and FIG. 14D).

The blocking structure 170 employed in the example embodiment may include an insulating liner 171 extending along side surfaces of the first channel layers 131 from a portion of the active pattern 105 on the other side of the first gate electrode 145A, and an insulating gap-fill portion 175 disposed on the insulating liner 171. For example, the insulating liner 171 may include silicon nitride, silicon oxynitride, or silicon carbonitride, and the insulating gap-fill portion 175 may include silicon oxide.

The insulating liner 171 may work as an epitaxial growth prevention layer. A level of the insulating liner 171 may be formed to be higher than at least an upper surface of the uppermost first channel layer. In example embodiments, an upper end level of the insulating liner 171 may overlap the intermediate insulating layer 160 in a horizontal direction. A "level" of a component or layer may be referred to herein with respect to an underlying or other common frame of reference, such as relative to the substrate 101. Components or layers described with reference to "overlap" in a particular direction may be at least partially obstructed by one another when viewed along a line extending in the particular direction or in a plane perpendicular to the particular direction.

In example embodiments, the insulating gap-fill portion 175 may be formed together during the formation of the first interlayer insulating layer 181 and may include the same material as a material of the first interlayer insulating layer 181. In this case, the insulating gap-fill portion 175 may have an upper surface disposed on the same level as a level of the upper surface of the first interlayer insulating layer 181.

The second transistor structure TR2 may include second channel layers 132 (also referred to as "upper channel layer"), a second gate electrode 145B surrounding the second channel layers 132, a second source/drain region 150B connected to the second channel layers 132 on both sides of the second gate electrode 145B (also referred to as an "upper source/drain region"), and a second gate insulating film 142B between the second channel layers 132 and the second gate electrode 145B.

A plurality of the second channel layers 132 (e.g., two or three second channel layers 132) may be provided, and each of the second channel layers 132 may include a semiconductor pattern. For example, the second channel layers 132 may include at least one of silicon (Si), silicon germanium (SiGe), and germanium (Ge). An intermediate insulating layer 160 may be disposed on the uppermost first channel layer among the first channel layers 131, and the second channel layers 132 may be stacked and spaced apart from each other in a vertical direction (e.g., Z direction) on the intermediate insulating layer 160. As such, the stacked first channel layers 131 and the stacked second channel layers 132 may be separated from each other by an intermediate insulating layer 160.

The intermediate insulating layer 160 may be disposed to overlap the first channel layers 131 and the second channel layers 132 in a direction perpendicular (e.g., Z direction). The intermediate insulating layer 160 may include an insulating material, and may include, for example, at least one of silicon nitride, silicon oxynitride, and silicon carbonitride. The intermediate insulating layer 160 may be a single insulating material layer, or may include a plurality of insulating material layers in example embodiments.

The second source/drain regions 150B may be disposed on both sides of the second channel layers 132 and may be provided as a source region or a drain region of the second transistor TR2. The second source/drain region 150B may include an epitaxial layer grown using both side surfaces of the second channel layer 132 as seed layers.

The semiconductor device 100 in the example embodiment may include a first interlayer insulating layer 181 surrounding a first transistor TR1 on a substrate 101 and a second interlayer insulating layer 182 surrounding the second transistor TR2 on the first interlayer insulating layer 181. As illustrated in FIG. 2, a portion of the first interlayer insulating layer 181 may cover the first source/drain region 150A connected to the lower contact 210A. Also, a portion of the second interlayer insulating layer 182 may fill a space between the second source/drain region 150B and the first interlayer insulating layer 181.

As described above, the second source/drain regions 150B may be spaced apart from the first source/drain region 150A and the blocking structure 170 in a vertical direction (e.g., Z direction) by a portion of regions of the first and second interlayer insulating layers 181 and 182.

In example embodiments, the first and second interlayer insulating layers 181 and 182 may be silicon oxide. For example, the interlayer insulating layers 181 and 182 may include spin-on hardmask (SOH), flowable oxide (FOX), tonen silazen (TOSZ), undoped silica glass (USG), borosilica glass (BSG), and phosphosilica glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), flowable CVD (FCVD) oxide, or combinations thereof. The interlayer insulating layer 161 may be formed using a chemical vapor deposition (CVD) process, a flowable-CVD process, or a spin coating process. In example embodiments, even though the first and second interlayer insulating layers 181 and 182 are formed of the same material, a boundary therebetween may be visually distinct.

The first and second source/drain regions 150A and 150B may include a semiconductor epitaxial material such as silicon (Si). The first and second source/drain regions 150A and 150B may include different types of impurities and/or different concentrations. For example, when the first transistor structure TR1 is a P-type MOSFET, the first source/drain regions 150A may include p-type doped silicon germanium (SiGe), and when the second transistor structure TR2 is an N-type MOSFET, the second source/drain regions 150A may include n-type doped silicon (Si). In example embodiments, the first transistor structure TR1 and the second transistor structure TR2 may be formed in a converse manner, differently from (e.g., the opposite of) the above example.

In the example embodiment, the first and second transistor structures TR1 and TR2 may share a gate structure GS. Specifically, the second gate electrode 145B may include the same electrode material as that of the first gate electrode 145A, and may have a common gate electrode 145 integrated therewith. Similarly, the first gate insulating film 142A and the second gate insulating film 142B may include the same gate insulating film 142. The same gate insulating film 142 may also surround the intermediate insulating layer 160 in the second direction (e.g., the Y direction). The gate structure GS may further include gate spacers 141. The gate spacers may intersect the first and second channel layers 131 and 132 from the upper surface of the second channel layers 132 of the gate electrode 145, and may be disposed on both sidewalls of the gate electrode portion 145B' extending in the second direction (e.g., the Y direction). A gate capping layer 147 may be formed on the gate electrode portion 145B' between the gate spacers 141.

The common gate electrode 145 may include a conductive material. For example, the common gate electrode 145 may include at least one of W, Ti, Ta, Mo, TiN, TaN, WN, TiON, TiAlC, TiAlN, and TaAlC. The common gate electrode 145 may include a semiconductor material such as doped polysilicon. Each of the common gate electrodes 145 may include two or more (i.e., multiple) layers. In example embodiments, the first gate electrode 145A and the second gate electrode 145B may include different conductive materials.

Each of the first and second gate insulating films 142A and 142B may include an oxide, a nitride, or a high-k material. The high-k material may refer to a dielectric material having a dielectric constant higher than that of silicon oxide film ($SiO_2$). The high-k material may be, for example, one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate spacers 141 may be disposed on both side surfaces of the common gate electrode 145. For example, the gate spacers 118 may include at least one of silicon oxide, silicon nitride, and silicon oxynitride. In example embodiments, gate spacers 141 may include a multilayer structure. For example, the gate capping layer 147 may include silicon nitride, silicon oxynitride, silicon carbonitride, or silicon oxycarbonitride.

The semiconductor device 100 in the example embodiment may further include a first lower contact 210A connected to the first source/drain region 150A, first upper contacts 210B connected to the second source/drain regions 150B, respectively, and a second contact 220 connected to the gate electrode 145.

The first upper contacts 210B may penetrate through the second interlayer insulating layer 182 and may be connected to the second source/drain regions 150B, respectively, and the second contact 220 may penetrate through the second interlayer insulating layer 182 and may be connected to the gate electrode 145. The first lower contact 210A may include a horizontal contact portion 210L connected to the first source/drain region 150A and extending in a horizontal direction (e.g., Y direction) with the upper surface of the substrate 101, and a vertical contact portion 210V connected to the horizontal contact portion 210L and extending in a direction perpendicular to the upper surface of the substrate 101 (e.g., Z direction). The horizontal contact portion 210L may be disposed on the first interlayer insulating layer 181, and the vertical contact portion 210V may be disposed to penetrate through the second interlayer insulating layer 182. For example, the contacts 210A, 210B, and 220 may include at least one of titanium nitride (TiN), tantalum nitride (TaN), tungsten nitride (WN), tungsten carbon nitride (WCN), titanium (Ti), tantalum (Ta), or tungsten (W), copper (Cu), aluminum (Al), cobalt (Co), ruthenium (Ru), and molybdenum (Mo).

In the semiconductor device 100 in the example embodiment, instead of forming a portion of the regions in which the source/drain region is or would otherwise be formed as floating epitaxial, a blocking structure 170 preventing the epitaxial growth may be disposed. Deterioration of electrical properties due to inactive source/drain region including floating epitaxial may be effectively prevented. A blocking structure replacing the source/drain region may be formed in various structures and positions.

Figure 4:
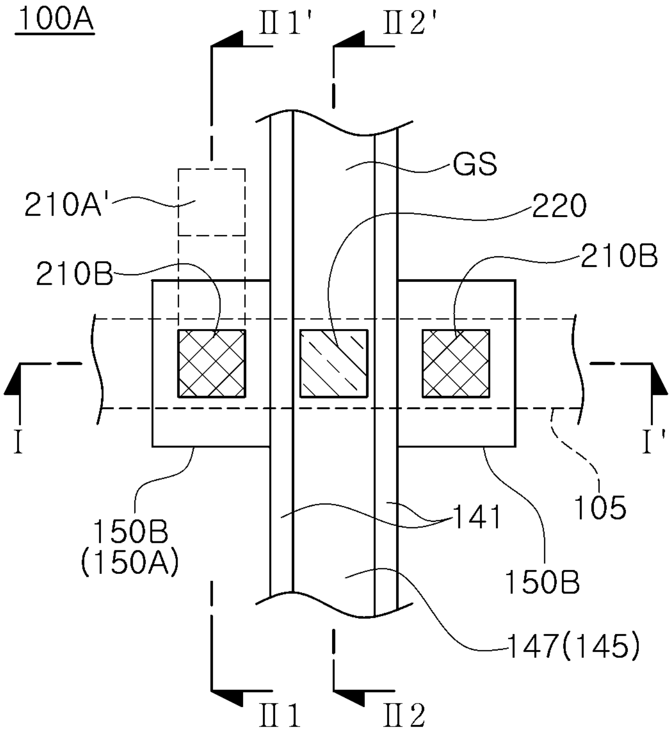
FIG. 4 is a plan diagram illustrating a semiconductor device according to an example embodiment of the present disclosure.
Figure 5:
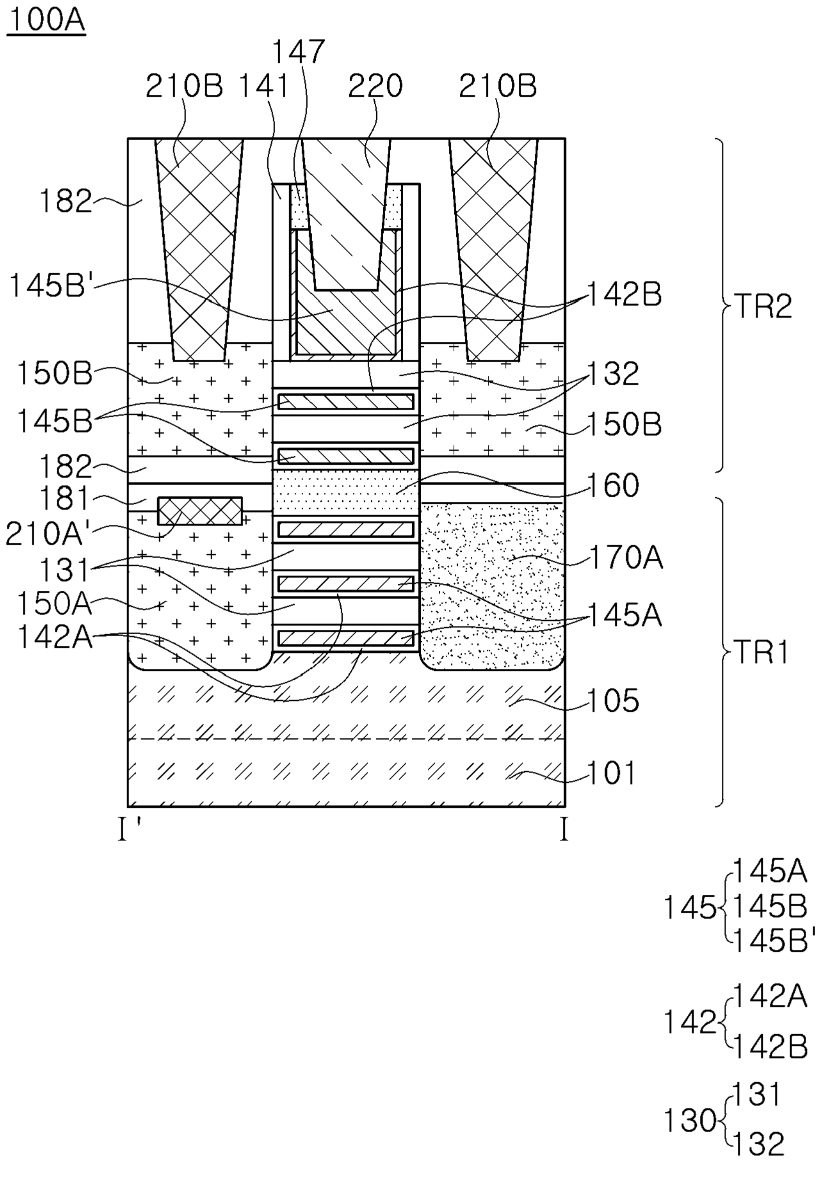
FIG. 5 is a cross-sectional diagram taken along line I-I' of FIG. 4.
Figure 6A:
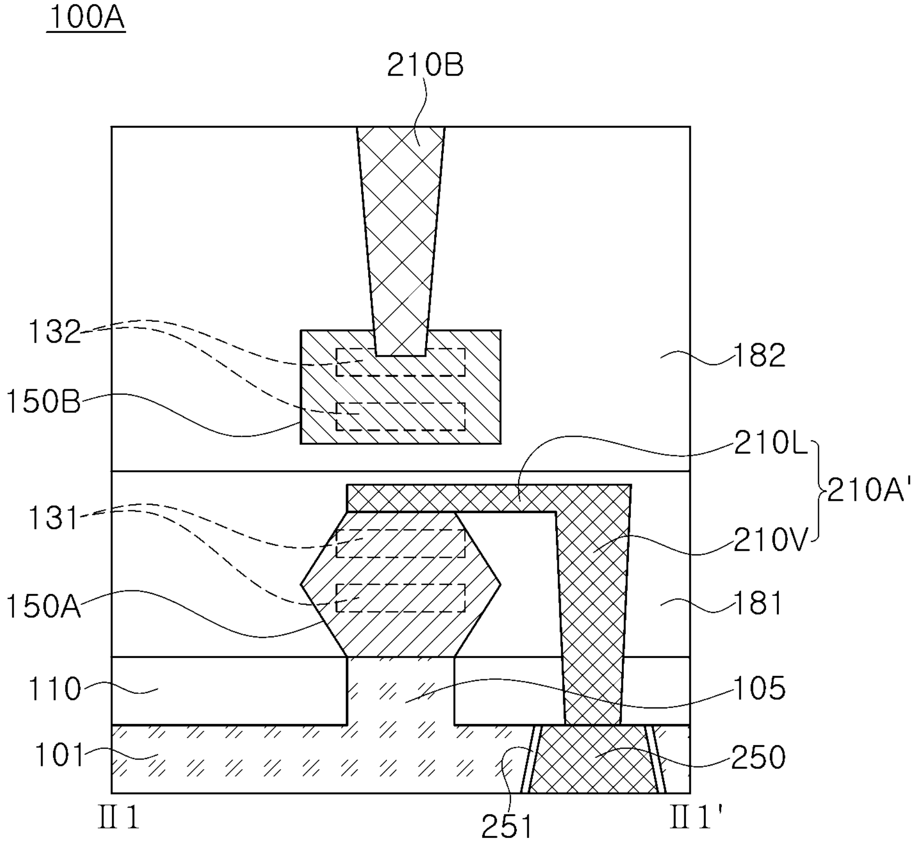
FIGS. 6A and 6B are cross-sectional diagrams illustrating the semiconductor device illustrated in FIG. 4 taken along lines II1-II1' and II2-II2' of FIG. 1.
Figure 6B:
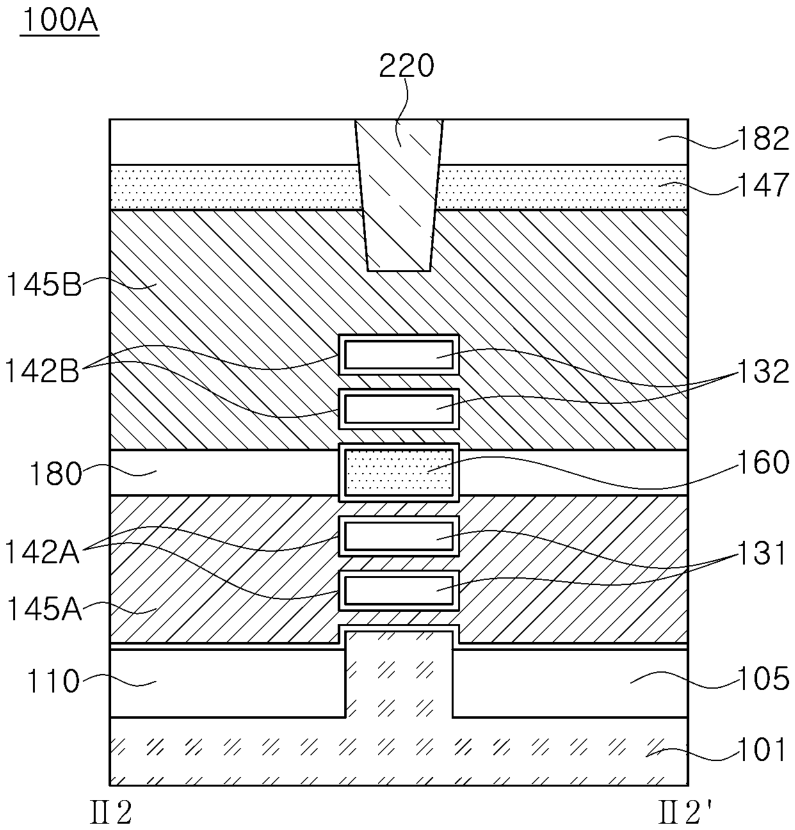

FIG. 4 is a plan diagram illustrating a semiconductor device according to an example embodiment. FIG. 5 is a cross-sectional diagram taken along line I-I' in FIG. 4. FIGS. 6A and 6B are cross-sectional diagrams illustrating the semiconductor device illustrated in FIG. 4 taken along line II1-II1' and II2-II2'.

Referring to FIGS. 4, 5, 6A, and 6B, the semiconductor device 100A in the example embodiment may be similar to the semiconductor device 100 illustrated in FIGS. 1 to 3B other than the configurations in which the blocking structure 170A may be formed as an insulating gap-fill structure without an insulating liner, the gate electrode 145 may have a structure in which the first and second gate electrodes 145A and 145B are separated from each other, and the first lower contact 210A' may be connected to the buried electrode 250 toward the substrate 101. Also, the components in the example embodiment may be understood with reference to the descriptions of the same or similar components of the semiconductor device 100 illustrated in FIGS. 1 to 3B unless otherwise indicated.

Referring to FIG. 5, the blocking structure 170A employed in the example embodiment may include a single insulating gap fill. The insulating gap fill may be disposed on a portion of the active pattern 105 on one side of the gate structure GS and may be connected to one side surfaces of the first channel layers 131. For example, the blocking structure 170A may include silicon nitride, silicon oxynitride, or silicon carbonitride.

Figure 14A:
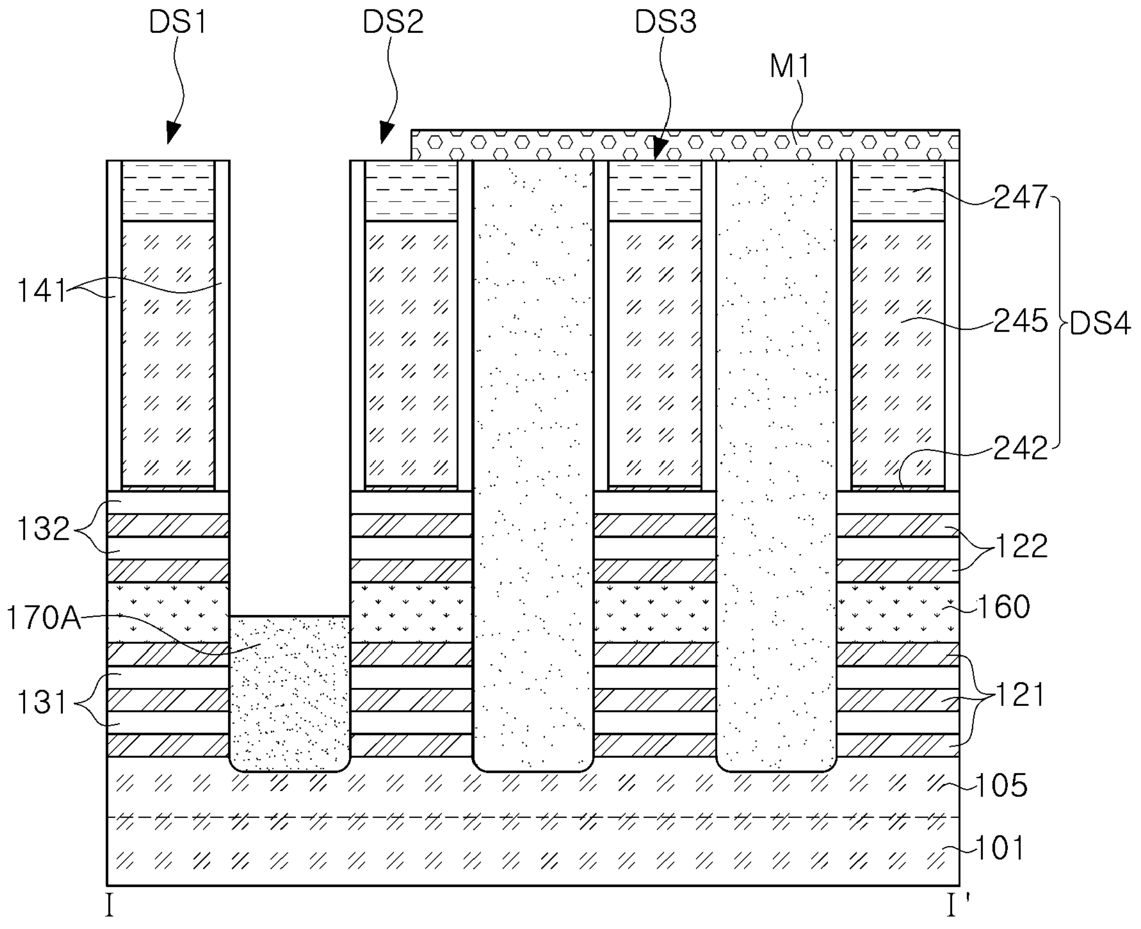
FIGS. 14A, 14B, 14C, 14D, and 14E are cross-sectional diagrams illustrating a semiconductor device according to example embodiments of the present disclosure.
Figure 14B:
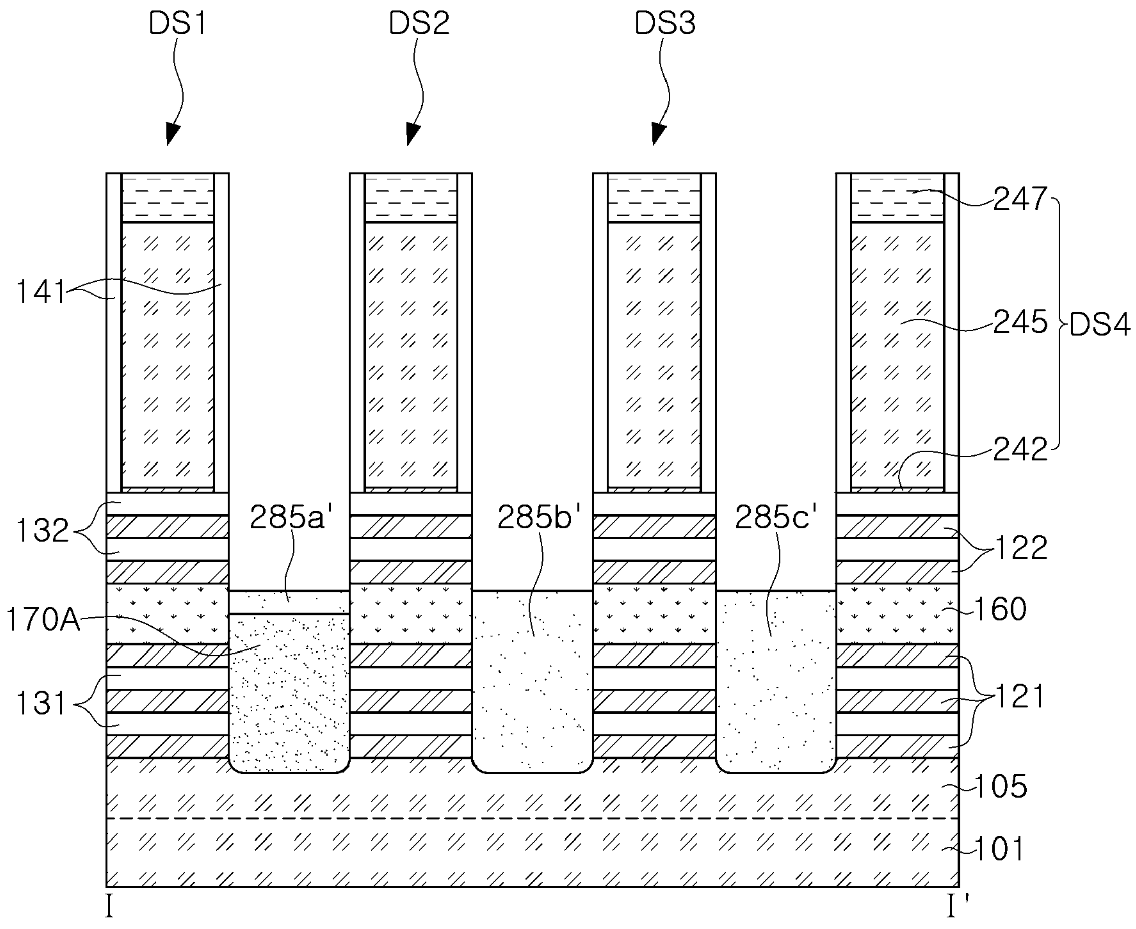
Figure 14C:
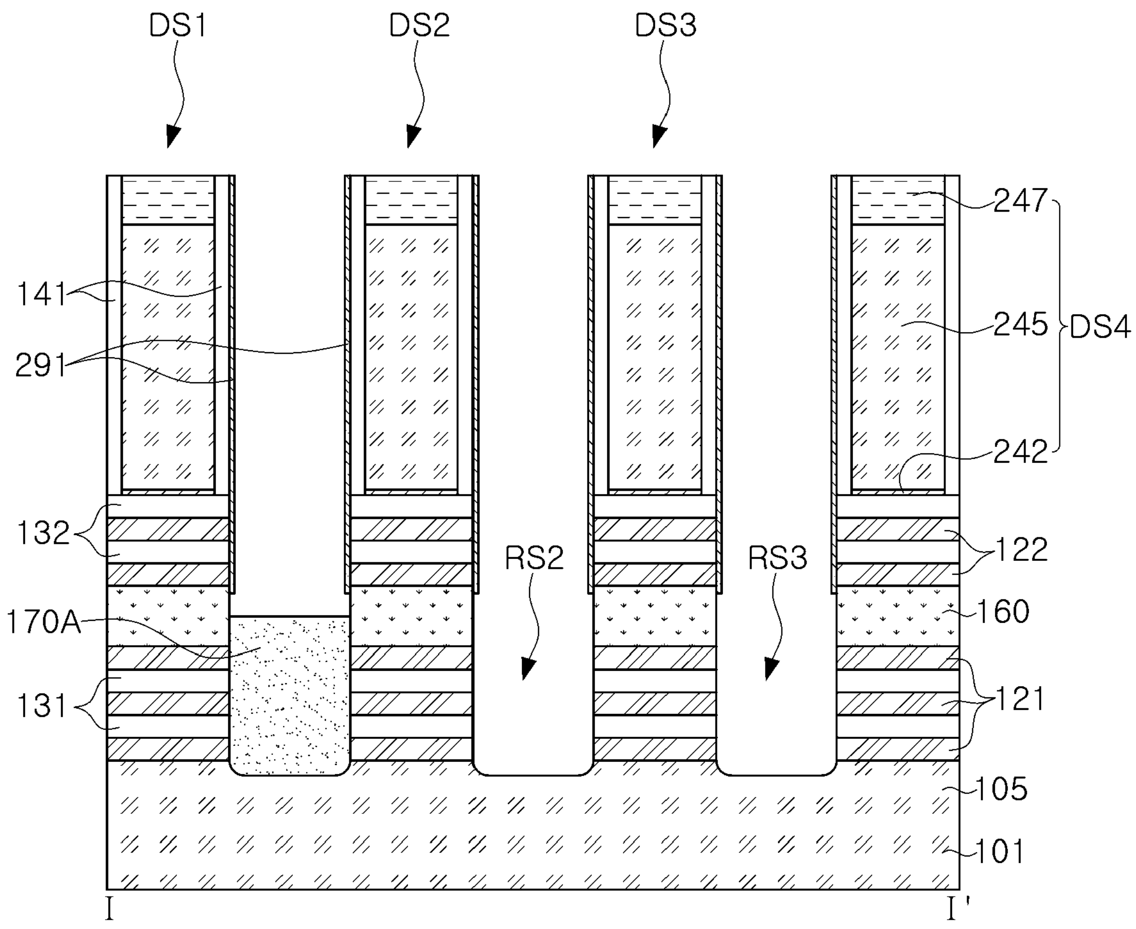
Figure 14D:
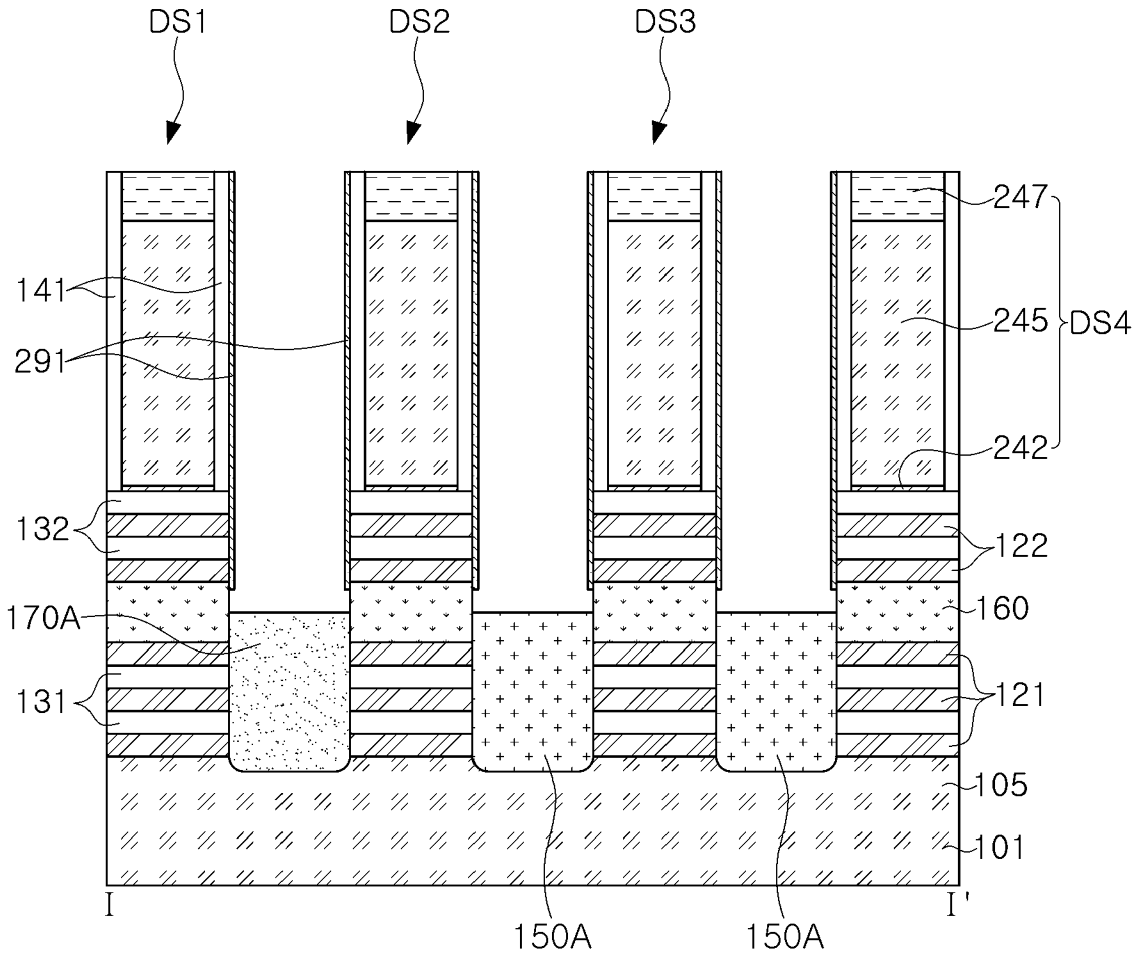
Figure 14E:
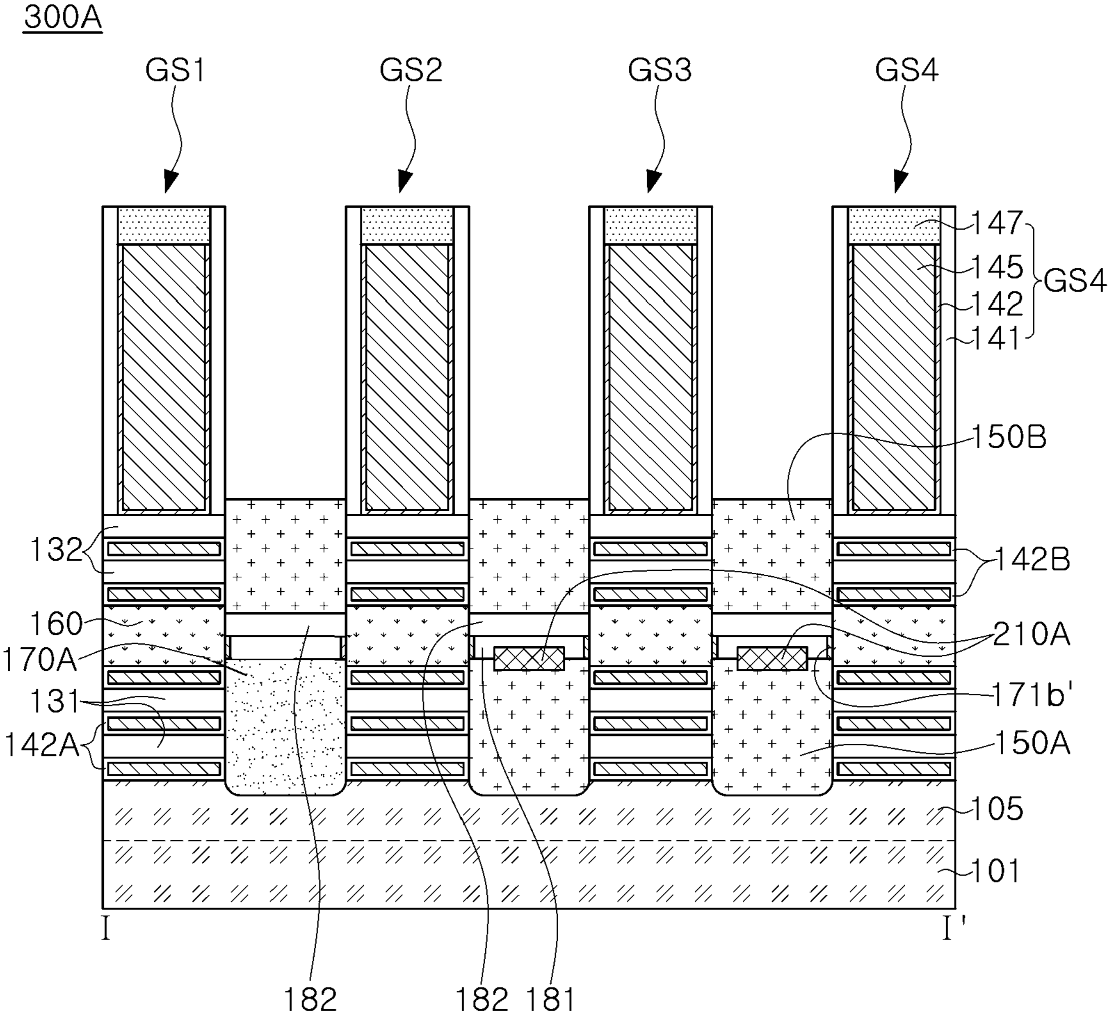

In the example embodiment, the epitaxial growth for the source/drain may be prevented using the blocking structure 170A, which is a gap-fill structure, without an insulating liner (see FIG. 14D). The blocking structure 170 may have an upper surface having a level higher than that of at least the upper surface of the uppermost first channel layer. In example embodiments, the level of an upper surface of the blocking structure 170 may overlap the intermediate insulating layer 160 in a horizontal direction. For example, as illustrated in FIG. 5, the upper surface of the blocking structure 170 may be higher than the upper surface of the first source/drain region 150A and may be lower than the upper surface of the first interlayer insulating layer 181.

The gate electrode 145 employed in the example embodiment may include first and second gate electrodes 145A and 145B separated from each other, differently from the common gate electrode described in the aforementioned example embodiment. As illustrated in FIG. 6B, the first gate electrode 145A surrounding the first channel layers 131 and the second gate electrode 145B surrounding the second channel layers 132 may be disposed with the inter-gate insulating pattern 180 interposed therebetween. At least a portion of the inter-gate insulating pattern 180 may be disposed to overlap the intermediate insulating layer 160 in a horizontal direction. The second gate electrode 145B may include a conductive material different from that of the first gate electrode 145A. Similarly, the first gate insulating film 142A and the second gate insulating film 142B may include different dielectric layers or a combination thereof.

In the example embodiment, the first lower contact 210A' may be configured to be connected to the buried electrode 250 toward the substrate 101. Referring to FIGS. 4 and 6A, a first lower contact 210A' may include a horizontal contact portion 210L connected to the first source/drain region 150A and extending in a horizontal direction (e.g., Y direction) with the upper surface 101 of the substrate, and a vertical contact portion 210V extending in a direction perpendicular to the upper surface of the substrate 101 (e.g., Z direction) to connect the horizontal contact portion 210L to the buried electrode 250. The buried electrode 250 may be connected to a through electrode (not illustrated) penetrating the substrate 101 or may be a portion of the through electrode. The first lower contact 210A' may be connected to an interconnection structure (not illustrated) disposed on the lower surface of the substrate 101 through the buried electrode 250 and the through electrode. The buried electrode 250 may be surrounded by an insulating liner 251 to electrically insulate the active region of the substrate 101.

In example embodiments, the first upper contact 210B may also include a horizontal contact portion and a vertical contact portion similarly to the first lower contact 210A. Accordingly, the first upper contact 210B may also be modified to be connected to the buried electrode or the through electrode disposed on the substrate.

Figure 6C:
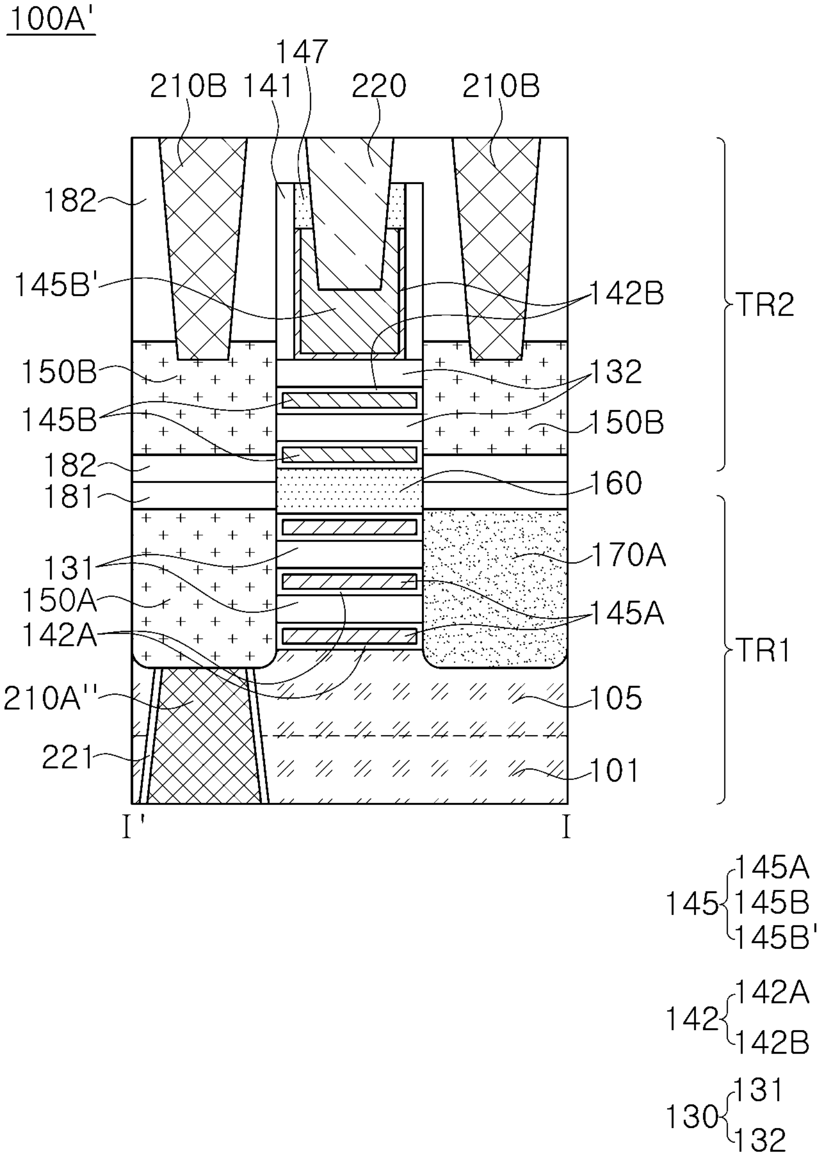
FIG. 6C is a cross-sectional diagram illustrating a semiconductor device according to an example embodiment of the present disclosure.

FIG. 6C is a cross-sectional diagram illustrating a semiconductor device according to an example embodiment, corresponding to FIG. 5.

The semiconductor device 100A' illustrated in FIG. 6C may be similar to the semiconductor device 100A illustrated in FIGS. 4, 5, 6A and 6B other than the configuration in which the first lower contact 210A" may be connected to the lower surface region of the first source/drain region 150A through the substrate 101. The components in the example embodiment may be understood with reference to the descriptions of the same or similar components of the semiconductor device 100A illustrated in FIGS. 4, 5, 6A and 6B.

Referring to FIG. 6C, the first lower contact 210A" employed in the example embodiment may be formed through the substrate 101, similarly to the buried electrode 250 described in the aforementioned example embodiment, and the first source/drain may be connected to the lower surface of the first source/drain region 150A. The first source/drain region 150A may be connected to an interconnection structure (not illustrated) disposed on the lower surface of the substrate 101 through the first lower contact 210A'. The first lower contact 210A" may be surrounded by an insulating liner 221 to electrically insulate the active region of the substrate 101.

Figure 7:
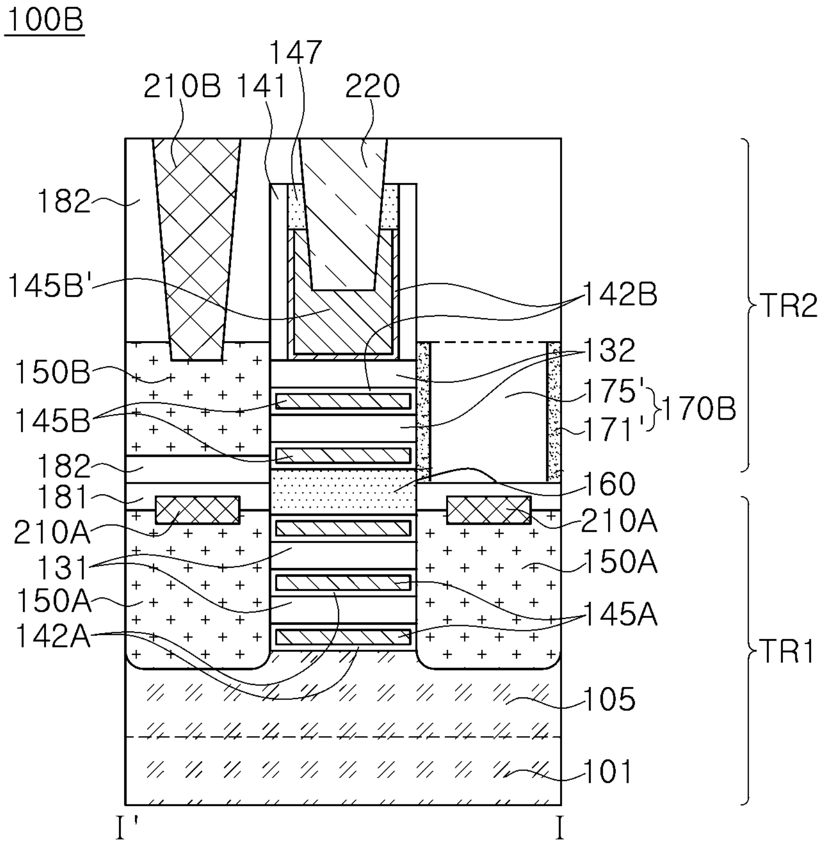
FIGS. 7 and 8 are cross-sectional diagrams illustrating a semiconductor device according to example embodiments of the present disclosure.
Figure 8:
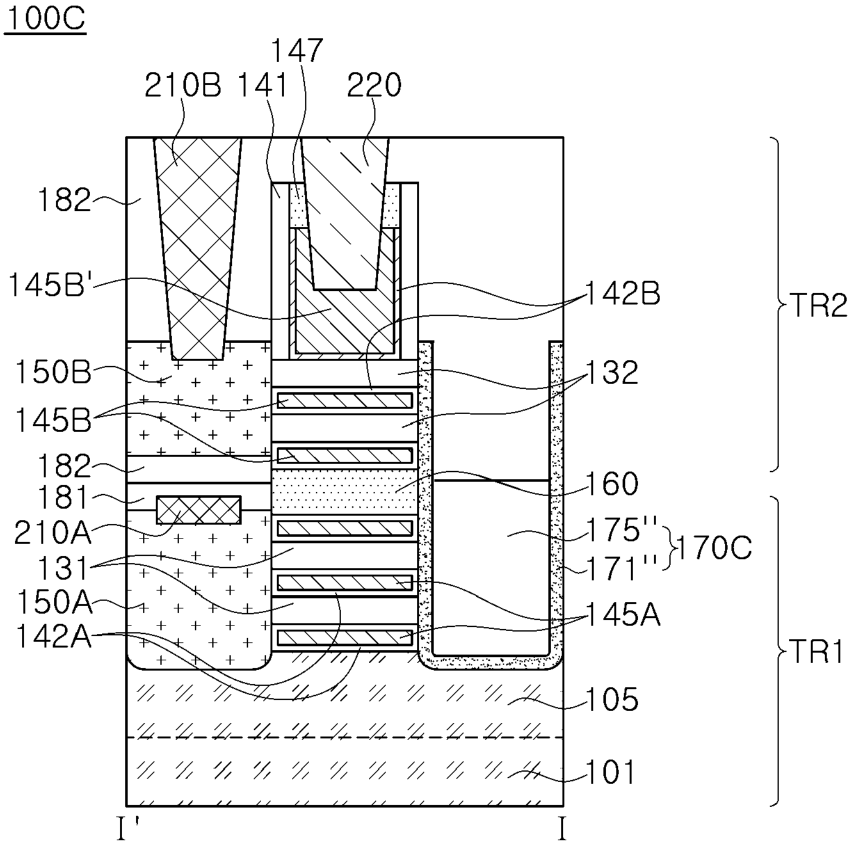

In the above-described example embodiment, the blocking structure for replacing the source/drain of the first transistor structure disposed at the bottom has been described, but the source/drain of the second transistor structure disposed in the upper portion may also be replaced by the blocking structure. FIGS. 7 and 8 are cross-sectional diagrams illustrating a semiconductor device according to example embodiments.

Referring to FIG. 7, the semiconductor device 100B in the example embodiment may be similar to the semiconductor device 100 illustrated in FIGS. 1 to 3B other than the configurations in which the blocking structure 170B may replace the source/drain of the second transistor structure TR2 disposed in the upper portion, and the lower first transistor structure TR1 may have source/drain regions on both sides of the gate structure GS. Also, the components in the example embodiment may be understood with reference to the descriptions of the same or similar components of the semiconductor device 100 illustrated in FIGS. 1 to 3B unless otherwise indicated.

In the example embodiment, the second transistor structure TR2 may include a second source/drain region 150B connected to one side surfaces of the second channel layers 132 on one side of the gate structure GS, and a blocking structure 170B connected to the other side surfaces of the second channel layers 132 on the other side of the gate structure GS.

By forming a blocking structure 170B in advance on the other side of the second gate electrode 145B before the epitaxial growth process for the second source/drain region 150B and covering the other side surfaces of the second channel layer 132 serving as the seed layer, epitaxial growth may be prevented.

The blocking structure 170B employed in the example embodiment may include an insulating liner 171' extending along the other side surfaces of the second channel layers 131 and an insulating gap-fill portion 175' disposed on the insulating liner 171'. For example, the insulating liner 171' may include silicon nitride, silicon oxynitride, or silicon carbonitride, and the insulating gap-fill portion 175' may include silicon oxide.

In the example embodiment, the insulating liner 171' may not be disposed on the bottom surface of the blocking structure 170B. The insulating liner 171' may be formed to cover at least other side surfaces of the second channel layers to prevent epitaxial growth.

In example embodiments, the insulating gap-fill portion 175' may be formed together during the formation of the second interlayer insulating layer 182, and may include the same material as that of the second interlayer insulating layer 182.

Referring to FIG. 8, the semiconductor device 100C in the example embodiment may be similar to the semiconductor device 100 illustrated in FIGS. 1 to 3B other than the configuration in which the blocking structure 170C may replace the source/drain on one side of the first and second transistor structures TR1 and TR2. Also, the components in the example embodiment may be understood with reference to descriptions of the same or similar components of the semiconductor device 100 illustrated in FIGS. 1 to 3B unless otherwise indicated.

In the example embodiment, the first and second transistor structures TR1 and TR2 may include first and second source/drain regions 150A and 150B connected to one side surfaces of the first channel layers 131 and one side surfaces of the second channel layers 132, respectively, on one side of the gate structure GS.

The blocking structure 170C employed in the example embodiment may have a structure extending in a vertical direction to replace a source/drain on one side of the first and second transistor structures TR1 and TR2. As illustrated in FIG. 8, the blocking structure 170C may be formed to cover the other side surfaces of the first channel layers 131 and the other side surfaces of the second channel layers 132 from a portion of the active pattern 105 on one side of the gate structure 100B.

The blocking structure 170C may include an insulating liner 171" extending from a portion of the active pattern 105 on the other side of the gate structure GS along other side surfaces of the first channel layers 131 and the second channel layers, and an insulating gap-fill portion 175" disposed on the insulating liner 171". For example, the insulating liner 171" may include silicon nitride or silicon oxynitride or silicon carbonitride, and the insulating gap-fill portion 175" may include silicon oxide.

The insulating liner 171" may be provided as an epitaxial growth prevention layer and may be continuously formed on the other side surface of the intermediate insulating layer 160. The level of the insulating liner 171" may be formed higher than the level of at least the upper surface of the uppermost second channel layer 132.

In example embodiments, the insulating gap-fill portion 175" may be formed together during the formation of the first interlayer insulating layer 181 and may include the same material as that of the first interlayer insulating layer 181. The insulating gap-fill portion 175" may have an upper surface disposed on the same level as a level of the upper surface of the first interlayer insulating layer 181. Also, the remaining inner region of the insulating liner 171" may be filled with the second interlayer insulating layer 182.

The blocking structures 170B and 170C illustrated in FIGS. 7 and 8 may include a combination of an insulating liner and an insulating gap-fill portion, but may only include an insulating gap-fill structure similarly to the blocking structure 170A illustrated in FIG. 5.

A semiconductor device in an example embodiment may be implemented as a static random access memory (SRAM). Specifically, when a MOSFET (e.g., N-type MOSFET) disposed on the upper level in SRAM is used as an access transistor, to prevent the source/drain region of the lower level MOSFET (e.g., P-type MOSFET) from being provided as a floating epitaxial, a blocking structure may be formed in the region such that epitaxial growth may be selectively blocked.

Figure 9:
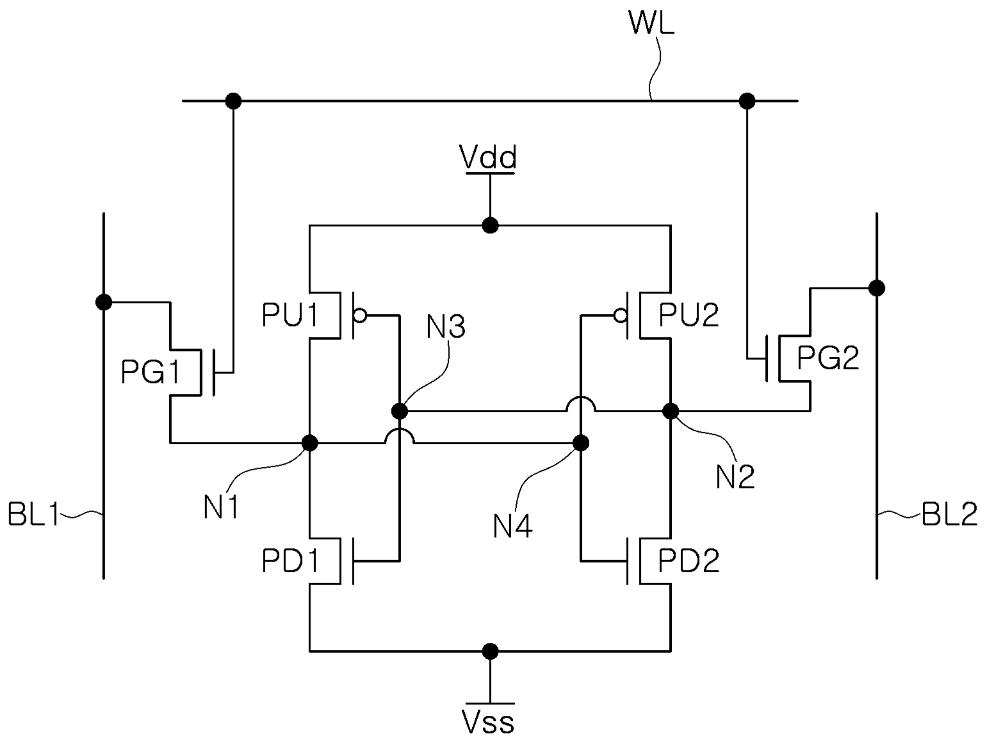
FIG. 9 is a perspective diagram illustrating a semiconductor device (SRAM cell) according to an example embodiment of the present disclosure.
Figure 10:
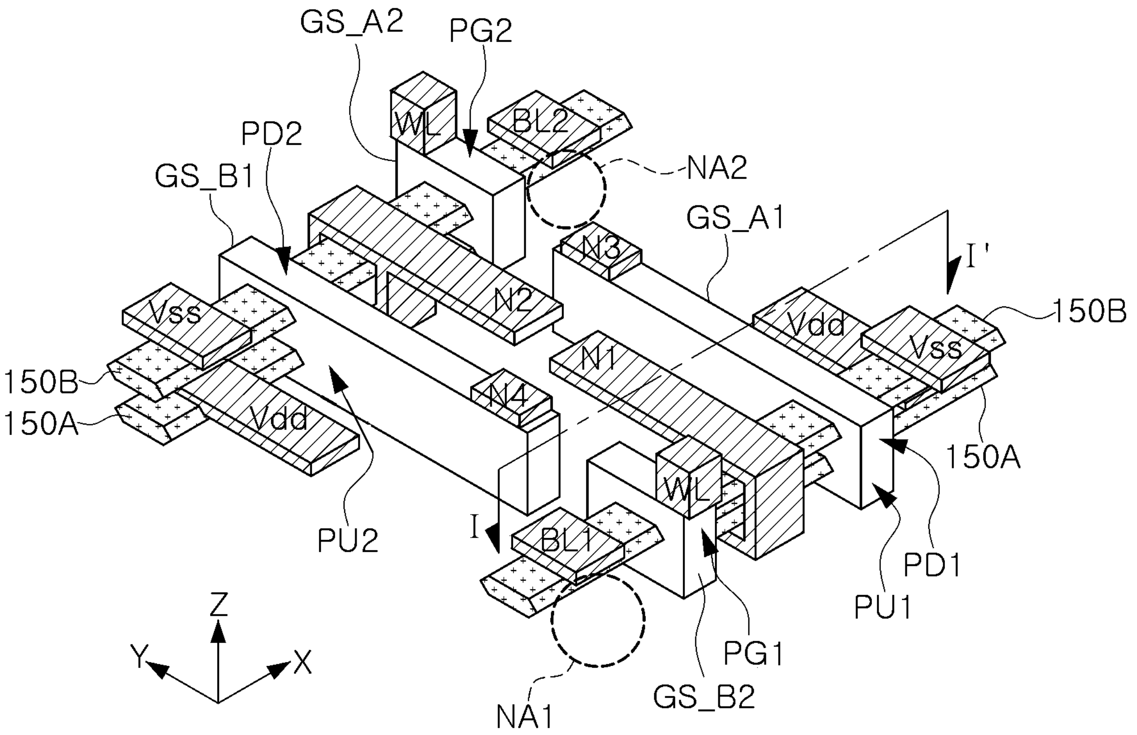
FIG. 10 is an equivalent circuit diagram illustrating the SRAM cell in FIG. 9.

FIG. 9 is an equivalent circuit diagram illustrating an SRAM cell, and FIG. 10 is a perspective diagram illustrating a semiconductor device according to an example embodiment, illustrating the SRAM cell corresponding to the equivalent circuit in FIG. 9.

Referring to FIGS. 9 and 10, the SRAM cell may include a first pull-up transistor PU1 (first pull-up transistor), a first pull-down transistor PD1 (first pull-down transistor), a second pull-up transistor PU2, a second pull-down transistor PD2, a first access transistor PG1, and a second access transistor PG2.

The first and second pull-up transistors PU1 and PU2 may be P-type MOSFETs, while the first and second pull-down transistors PD1 and PD2 and the first and second access transistors PG1 and PG2 may be N-type MOSFETs.

As illustrated in FIG. 10, the first transistor structure TR1 (the lower transistor structure) of the above-described example embodiments may be a P-type MOSFET, and may be included in the first and second pull-up transistors PU1 and PU2, and the second transistor structure TR2 (the upper transistor structure) may be N-type MOSFETs, and may be included in the first and second pull-down transistors PD1 and PD2 and the first and second access transistors PG1 and PG2.

The first pull-up transistor PU1 and the first pull-down transistor PD1 may be included in a first inverter. The first gate electrodes GS_A1 connected to each other of the first pull-up and first pull-down transistors PU1 and PD1 may correspond to the input terminal N3 of the first inverter, and the first node N1 may correspond to the output terminal of the first inverter.

The second pull-up transistor PU2 and the second pull-down transistor PD2 may be included in a second inverter. The second gate electrode GS_B1 connected to each other of the second pull-up and second pull-down transistors PU2 and PD2 may correspond to the input terminal N4 of the second inverter, and the second node N2 may correspond to the output terminal of the second inverter.

The first and second inverters may be combined to form a latch structure. The first gate electrode GS_A1 of the first pull-up and first pull-down transistors PU1 and PD1 may be electrically connected to the second node N2. The second gate electrode GS_B1 of the second pull-up and pull-down transistors PU2 and PD2 may be electrically connected to the first node N1. Second sources/drains of the first pull-up transistor PU1 and the second pull-up transistor PU2 may be connected to the power supply voltage Vdd. Second sources/drains of the first pull-down transistor PD1 and the second pull-down transistor PD2 may be connected to the ground voltage Vss.

A first source/drain of the first access transistor PG1 may be connected to the first node N1, and a second source/drain of the first access transistor PG1 may be connected to the first bit line BL1. Similarly, the first source/drain of the second access transistor PG2 may be connected to the second node N2, and the second source/drain of the second access transistor PG2 may be connected to the second bit line BL2. Gate electrodes GSA2 and GS_B2 of the first and second access transistors PG1 and PG2 may be electrically connected to the word line WL. As illustrated in FIG. 10, the first gate electrode GS_A1 and the third gate electrodes GS_A2 may be obtained by dividing a gate structure using a gate separation structure. Similarly, the second gate electrode GS_B1 and the fourth gate electrodes GS_B2 may be obtained by dividing another gate structure using a gate separation structure.

As such, the SRAM cells illustrated in FIG. 9 may be implemented as upper and lower transistor structures, respectively, as illustrated in FIG. 10, similarly to the above-described example embodiments. The first pull-down transistor PD1, the first access transistor PG1, the second pull-down transistor PD2, and the second access transistor PG2 may be an upper structure implemented as the second transistor structure TR2 (second channel layer 132), and the first pull-up transistor PU1 and the second pull-up transistor PU2 may be a lower structure implemented as the first transistor structure TR1 (first channel layer 131).

A structure disposed below each of the first and second access transistors, which are N-type MOSFETs may remove or deactivate the source/drain region to disable the P-type MOSFET. In the example embodiment, the source/drain region may be replaced with the aforementioned blocking structure. Since epitaxial growth for the source/drain is fundamentally blocked in the blocking structure, floating epitaxial may not be provided. Accordingly, the issues such as deterioration of electrical properties due to floating epitaxial may be effectively addressed.

Figure 11:
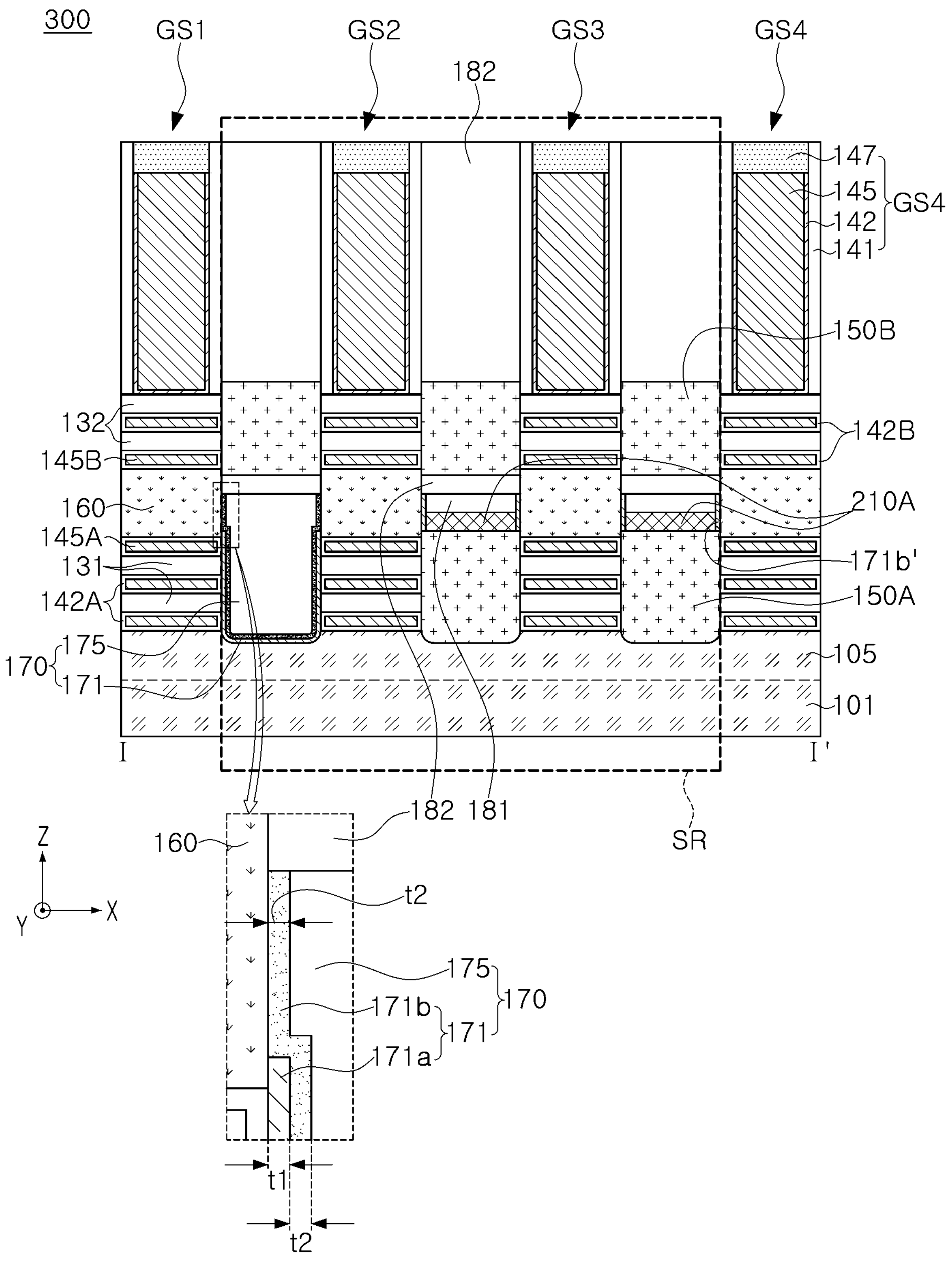
FIG. 11 is a cross-sectional diagram illustrating a semiconductor device according to example embodiments of the present disclosure.

FIG. 11 is a cross-sectional diagram illustrating a semiconductor device according to example embodiments.

Referring to FIG. 11, a semiconductor device 300 in the example embodiment may include a substrate 101 having an active pattern 105 extending in a first direction (e.g., X direction), four first transistor structures TR1 spaced apart from each other in a first direction on the active pattern 105, and a second transistor structures TR2 disposed on the four first transistor structures TR1, respectively. As such, the four stacked transistor structures may be disposed on first to fourth regions spaced apart from each other in the first direction in the active pattern 105, respectively. Here, portion “SR” may be a cross-section of the SRAM cell taken along line I-I'.

Specifically, the semiconductor device 300 in the example embodiment may include lower channel layers 131 stacked and spaced apart from each other on the first to fourth regions of the active pattern 105 in a direction perpendicular to the upper surface of the substrate 101 (e.g., Z direction), intermediate insulating layers 160 disposed on uppermost lower channel layers among the lower channel layers 131, respectively, and upper channel layers 132 stacked and spaced apart from each other on the first to third intermediate insulating layers 160 in the vertical direction (e.g., Z direction).

A plurality of the lower and upper channel layers 131 and 132 (e.g., two or three lower and upper channel layers) may be provided, and each of the lower and upper channel layers may include a semiconductor pattern. For example, the lower and upper channel layers 131 and 132 may include at least one of silicon (Si), silicon germanium (SiGe), and germanium (Ge). The stacked lower channel layers 131 and the stacked upper channel layers 132 may be separated from each other by an intermediate insulating layer 160. The intermediate insulating layer 160 may overlap the first channel layers 131 and the second channel layers 132 in a direction perpendicular (e.g., Z direction). The intermediate insulating layer 160 may include an insulating material, for example, at least one of silicon nitride, silicon oxynitride, and silicon carbonitride. The intermediate insulating layer 160 may be a single insulating material layer, but may include a plurality of insulating material layers in example embodiments.

The first to fourth gate structures GS1, GS2, GS3, and GS4 may extend in the second direction (e.g., the Y direction) to intersect the first to fourth regions of the active pattern 105, respectively.

The first to fourth gate structures GS1, GS2, GS3, and GS4 may include gate electrodes 145 surrounding the lower channel layers 131 and the upper channel layers 132, a gate insulating layer 142 between the lower and upper channel layers 131 and 132 and the gate electrode 145, a gate spacer 141 disposed on both sides of the gate electrode 145, and a gate capping layer 147 disposed on the gate electrode 145 between the gate spacers 141.

The first to fourth gate structures GS1, GS2, GS3, and GS4 employed in the example embodiment may be provided as a common gate structure for the first and second transistor structures TR1 and TR2. The first gate electrode 145A surrounding the lower channel layers 131 and the second gate electrode 145B surrounding the upper channel layers 132 may include the same gate electrode material. Similarly, the first gate insulating film 142A and the second gate insulating film 142B may include the same material as gate insulating film 142.

Also, the semiconductor device 300 may include lower source/drain regions 150A connected to lower channel layers 131 on both sides between the second and third gate structures GS2 and GS3 and between the third and fourth gate structures GS3 and GS4, respectively, and upper source/drain regions 150B connected to upper channel layers 132 on both sides between the first and second gate structures GS1 and GS2, between the second and third gate structures GS2 and GS3, and between the third and fourth gate structures GS3 and GS4.

The lower and upper source/drain regions 150A and 150B may include a semiconductor epitaxial material such as silicon (Si). The lower and upper source/drain regions 150A and 150B may include different types of impurities and/or different concentrations.

The semiconductor device 300 in the example embodiment may include an SRAM cell SR. The first transistor structure TR1 may be a P-type MOSFET, and the second transistor structure TR2 may be an N-type MOSFET. When a P-type MOSFET is implemented, the first source/drain regions 150A may include p-type doped silicon germanium (SiGe), and when an N-type MOSFET is implemented, the second source/drain regions 150A may include n-type doped silicon (Si).

The semiconductor device 300 in the example embodiment may include a blocking structure 170 disposed between the first and second gate structures GS1 and GS2 and connected to lower channel layers 131 disposed on both sides thereof. The blocking structure 170 may be understood as a structure replacing an existing floating source/drain region, such as region "NA1" in FIG. 10.

The blocking structure 170 employed in the example embodiment may include an insulating liner 171 extending from a portion of the active pattern 105 along side surfaces of the lower channel layers 131 between the first and second gate structures GS1 and GS2, and an insulating gap-fill portion 175 disposed on the insulating liner 171. For example, the insulating liner 171 may include silicon nitride, silicon oxynitride, or silicon carbonitride, and the insulating gap-fill portion 175 may include silicon oxide.

The insulating liner 171 may be provided as an epitaxial growth prevention layer. A level of the insulating liner 171 may be formed to be higher than a level of at least an upper surface of the uppermost first channel layer. In example embodiments, an upper end level of the insulating liner 171 may overlap the intermediate insulating layer 160 in a horizontal direction.

An insulating liner 171 employed in the example embodiment may include a first insulating liner 171*a* and a second insulating liner 171*b* on the first insulating liner 171*a*. The first insulating liner 171*a* and the second insulating liner 171*b* may have different levels. For example, an upper end level of the second insulating liner 171*b* may be higher than an upper end level of the first insulating liner 171*a*.

As illustrated in FIG. 11, an upper end of the first insulating liner 171*a* may have substantially the same level as a level of an upper surface of the lower source/drain region 150A. A level of an upper end of the second insulating liner 171*b* may be higher than a level of an upper level of the first insulating liner 171*a* and may have substantially the same level as a level of an upper surface of the first interlayer insulating layer 181. In example embodiments, the second insulating liner 171*b* may include the same material as that of the insulating barrier 171*b*' around the lower contacts 210, and the second insulating liner 171*b* and the insulating barrier 171*b*' may be formed on the same level.

The first insulating liner 171*a* and the second insulating liner 171*b* may be conformally formed. The first insulating liner 171*a* and the second insulating liner 171*b* may have a first thickness t1 and a second thickness t2, respectively.

As described above, the insulating liner 171 employed in the example embodiment may be divided into a lower region in which first and second insulating liners 171*a* and 171*b* are stacked and an upper region in which only the second insulating liner 171*b* is disposed. A thickness (t1+t2) of the lower region of the insulating liner 171 may be greater than a thickness t2 of the upper region of the insulating liner 171.

In example embodiments, the insulating gap-fill portion 175 may be formed together during the formation of the first interlayer insulating layer 181 and may include the same material as that of the first interlayer insulating layer 181. In this case, the insulating gap-fill portion 175 may have an upper surface disposed on the same level as a level of the upper surface of the first interlayer insulating layer 181.

The semiconductor device 300 in the example embodiment may include a first interlayer insulating layer 181 surrounding a first transistor TR1 on a substrate 101, and a second interlayer insulating layer 182 surrounding the second transistor TR2 on the first interlayer insulating layer 181. As illustrated in FIG. 2, a portion of the first interlayer insulating layer 181 may cover the first source/drain region 150A connected to the lower contact 210A. Also, a portion of the second interlayer insulating layer 182 may fill a space between the second source/drain region 150B and the first interlayer insulating layer 181.

As such, the upper source/drain regions 150B may be spaced apart from the lower source/drain region 150A and the blocking structure 170 by a portion of regions of the first and/or second interlayer insulating layers 181 and/or 182 in a vertical direction (e.g., Z direction).

In the semiconductor device 300 in the example embodiment, a blocking structure 170 replacing a floating epitaxial may be disposed in a portion of regions among regions in which a source/drain region is or would otherwise be formed. Deterioration of electrical properties due to floating epitaxial may be effectively prevented. The blocking structure 170 replacing the source/drain region may be formed in various structures and positions. For example, the blocking structure may include a single insulating gap-fill portion (see FIGS. 4 to 6). Also, the blocking structure may be configured to replace the lower source/drain region and also the upper source/drain region (see FIGS. 7 and 8).

FIGS. 12A to 12K are cross-sectional diagrams illustrating a semiconductor device according to example embodiments. FIG. 13 is a plan diagram illustrating the semiconductor structure in FIG. 12A. The manufacturing process in FIGS. 12A to 12K may be understood as a method of manufacturing the semiconductor device 300 illustrated in FIG. 11.

Figure 12A:
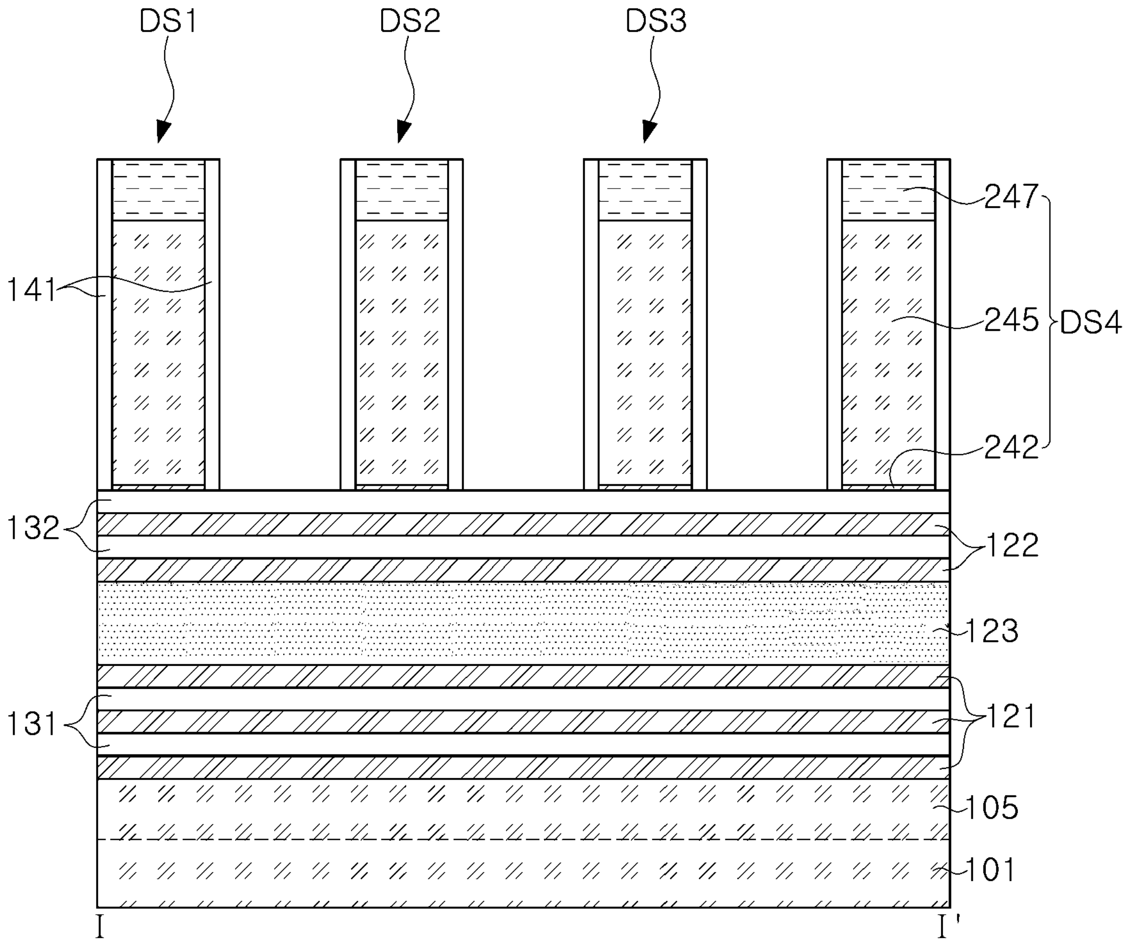
FIGS. 12A, 12B, 12C, 12D, 12E, 12F, 12G, 12H, 12I, 12J, and 12K are cross-sectional diagrams illustrating a semiconductor device according to example embodiments of the present disclosure.
Figure 13:
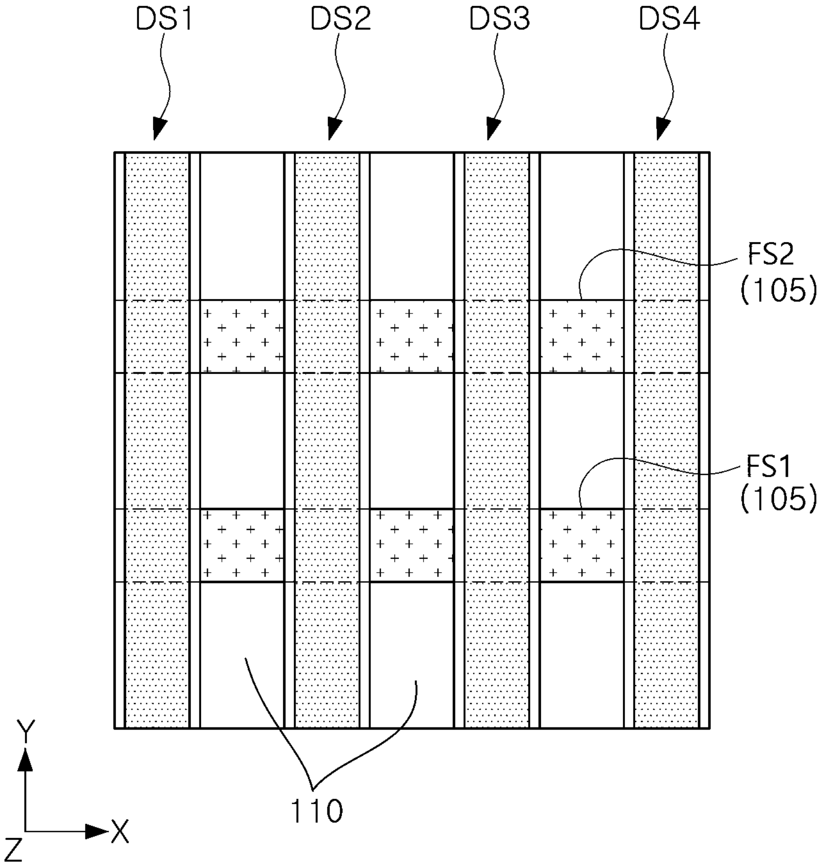
FIG. 13 is a plan diagram illustrating the semiconductor structure in FIG. 12A.

Referring to FIGS. 12A and 13, first and second fin-type stack structures FS1 and FS2 for the first and second transistor structures may be disposed on an active pattern 105 extending in a first direction (e.g., X direction) on a substrate 101, and the first to fourth dummy gate structures DS1, DS2, DS3, and DS4 in the second direction (e.g., the Y direction) to intersect the first and second fin-type stack structures FS1 and FS2 may be included.

The first and second fin-type stack structures FS1 and FS2 may include a first stack structure in which first sacrificial layers 121 and a first channel layer 131 are alternately stacked, respectively, a second stack structure in which the second sacrificial layers 122 and the second channel layers 132 are alternately stacked, and an intermediate sacrificial layer 123 between the first and second stack structures.

The intermediate sacrificial layer 123 may be removed in a subsequent process and may be provided as a space for the intermediate insulating layer 160 illustrated in FIG. 11, and the first sacrificial layers 121 and the second sacrificial layers 122 may be removed in a subsequent process and may provide a space for the gate insulating film 142 and the gate electrode 145 illustrated in FIG. 11. The first channel layer 131 and the second channel layer 132 may include a semiconductor material for forming channels of the first and second transistor structures. The first channel layer 131 and the second channel layer 132 may include, for example, a semiconductor material including at least one of silicon (Si), silicon germanium (SiGe), and germanium (Ge). The first channel layer 131 and the second channel layer 132 may include impurities, but an example embodiment thereof is not limited thereto.

The intermediate sacrificial layer 123 and the first and second sacrificial layers 121 and 122 may include different materials to have etch selectivity with the first and second channel layers 131 and 132. Similarly, the intermediate sacrificial layer 123 may include a material different from that of the first and second sacrificial layers 121 and 122 to have etch selectivity. In example embodiments (e.g., when the first and second gate electrodes are formed of different gate electrode materials), the first sacrificial layer 121 may include a material different from that of the second sacrificial layers 122 to have etch selectivity.

In example embodiments, the intermediate sacrificial layer 123 and the first and second sacrificial layers 121 and 122 may include silicon germanium (SiGe), and the first and second channel layers 131 and 132 may include silicon (Si). Also, the intermediate sacrificial layer 123 may have a Ge content higher than that of the first and second sacrificial layers 121 and 122. Each of the intermediate sacrificial layer 123, the first and second sacrificial layers 121 and 122, and the first and second channel layers 131 and 132 may have a thickness in a range of about 1 to 100 nm. In example embodiments, the number of first and second channel layers 131 and 132 alternately stacked with the first and second sacrificial layers 121 and 122 may be varied.

First to fourth dummy gate structures DS1, DS2, DS3, and DS4 and gate spacers 141 may be formed on the first and second fin-type stack structures FS1 and FS2. The first to fourth dummy gate structures DS1, DS2, DS3, and DS4 may be sacrificial structures defining first and fourth gate structures GS1, GS2, GS3, and GS4 to be formed in subsequent processes, respectively. The first to fourth dummy gate structures DS1, DS2, DS3, and DS4 may have a line or linear shape extending in the second direction (e.g., the Y direction) by intersecting the first and second fin-type stack structures FS1 and FS2, and may be spaced apart from each other in the first direction (e.g., X direction). The first to fourth dummy gate structures DS1, DS2, DS3, and DS4 may include first and second dummy material layers 242 and 245 stacked in order and a mask pattern layer 247.

The first and second dummy material layers 242 and 245 may be patterned using the mask pattern layer 247. The first and second dummy material layers 242 and 245 may be an insulating layer and a conductive layer, respectively, but an example embodiment thereof is not limited thereto, and the first and second dummy material layers 242 and 245 may be formed as an integrated layer. In example embodiments, the first dummy material layer 242 may include silicon oxide, and the second dummy material layer 245 may include polysilicon. The mask pattern layer 247 may include silicon oxide and/or silicon nitride.

The gate spacers 141 may be formed on both sidewalls of the first to fourth dummy gate structures DS1, DS2, DS3, and DS4. The gate spacers 141 may be formed by forming a film of uniform thickness along the upper and side surfaces of the substrate on which the dummy gate structures DS1, DS2, DS3, and DS4 are formed, and performing anisotropic etching. The gate spacers 141 may be formed of a low-k material, and may include, for example, at least one of SiO, SiN, SiCN, SiOC, SiON, and SiOCN.

Figure 12B:
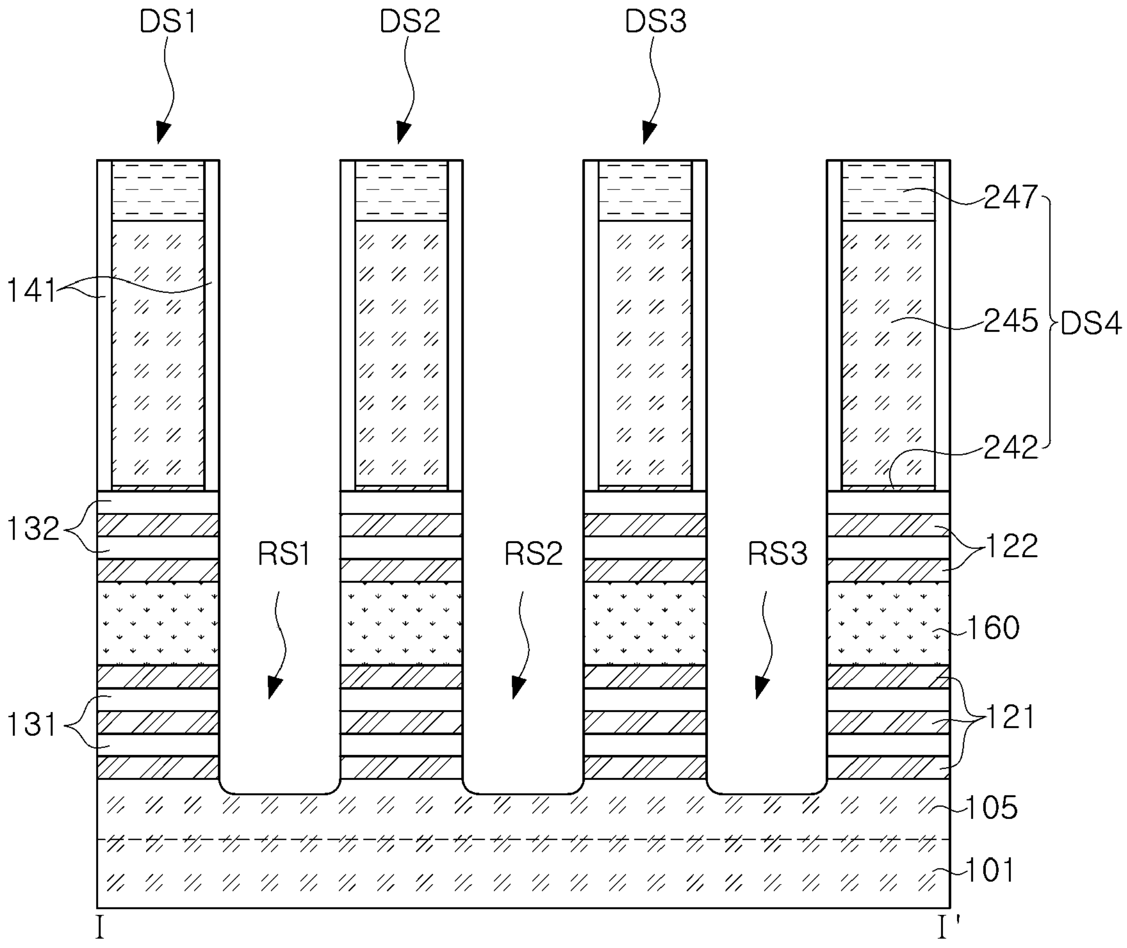

A gap region may be formed by selectively removing the intermediate sacrificial layer 123 from the first and second fin-type stack structures FS1 and FS2, and an intermediate insulating layer 160 may be formed by filling the gap region with an insulating material (see FIG. 12B). For example, the intermediate insulating layer 160 may include at least one of SiO, SiN, SiCN, SiOC, SiON, SiOCN, SiBN, and SiBCN.

Referring to FIG. 12B, the fin-type stack structures FS1 and FS2 may be removed from a region between the first to fourth dummy gate structures DS1, DS2, DS3, and DS4, thereby forming first to third recess regions RS1, RS2, and RS3 in the active pattern 105.

In this process, the exposed fin-type stacked stack structures FS1 and FS2 may be removed using the first to fourth dummy gate structures DS1, DS2, DS3, and DS4 and the gate spacers 141 as masks. Through this process, the first and second channel layers 131 and 132 may have desired lengths in the first direction (e.g., the X direction). Portions of the active pattern 105 exposed by the first to third recess regions RS1, RS2, and RS3 and the first channel layers may be provided as regions for forming an epitaxial pattern for the lower source/drain region. Before forming the lower source/drain region through a subsequent process, the blocking structure 170 may be formed in the first recess region RS1.

Figure 12C:
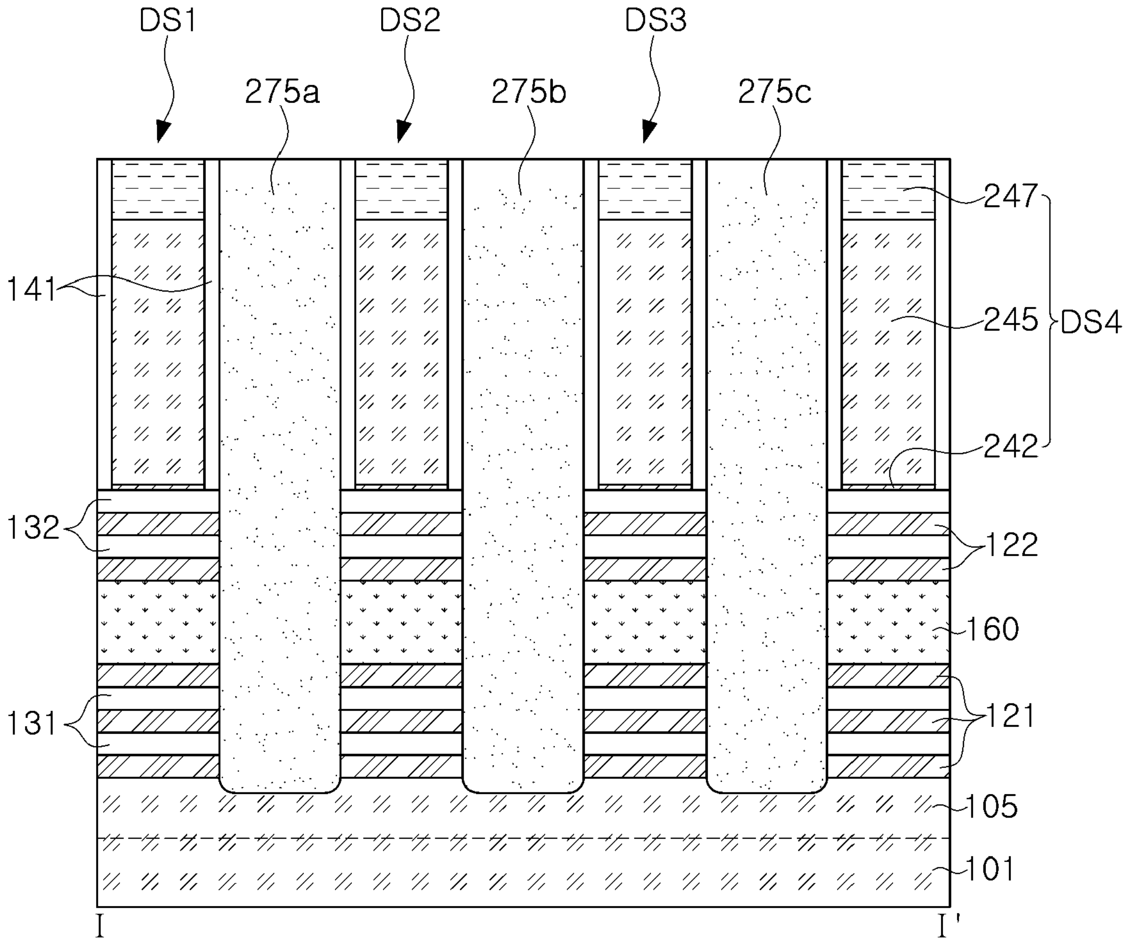

Referring to FIG. 12C, first gap-fill insulating layers 275*a*, 275*b*, and 275*c* may be formed in the first to third recess regions RS1, RS2, and RS3.

In the process of forming the first gap-fill insulating layer 275*a*, 275*b*, and 275*c*, the first gap-fill insulating layer 275*a*, 275*b*, and 275*c* may be obtained by forming a first insulating material layer to fill spaces between the first to fourth dummy gate structures DS1, DS2, DS3, and DS4 and performing planarization process such as chemical mechanical polishing (CMP). The first gap-fill insulating layers 275*a*, 275*b*, and 275*c* may be silicon oxide such as SOH.

Figure 12D:
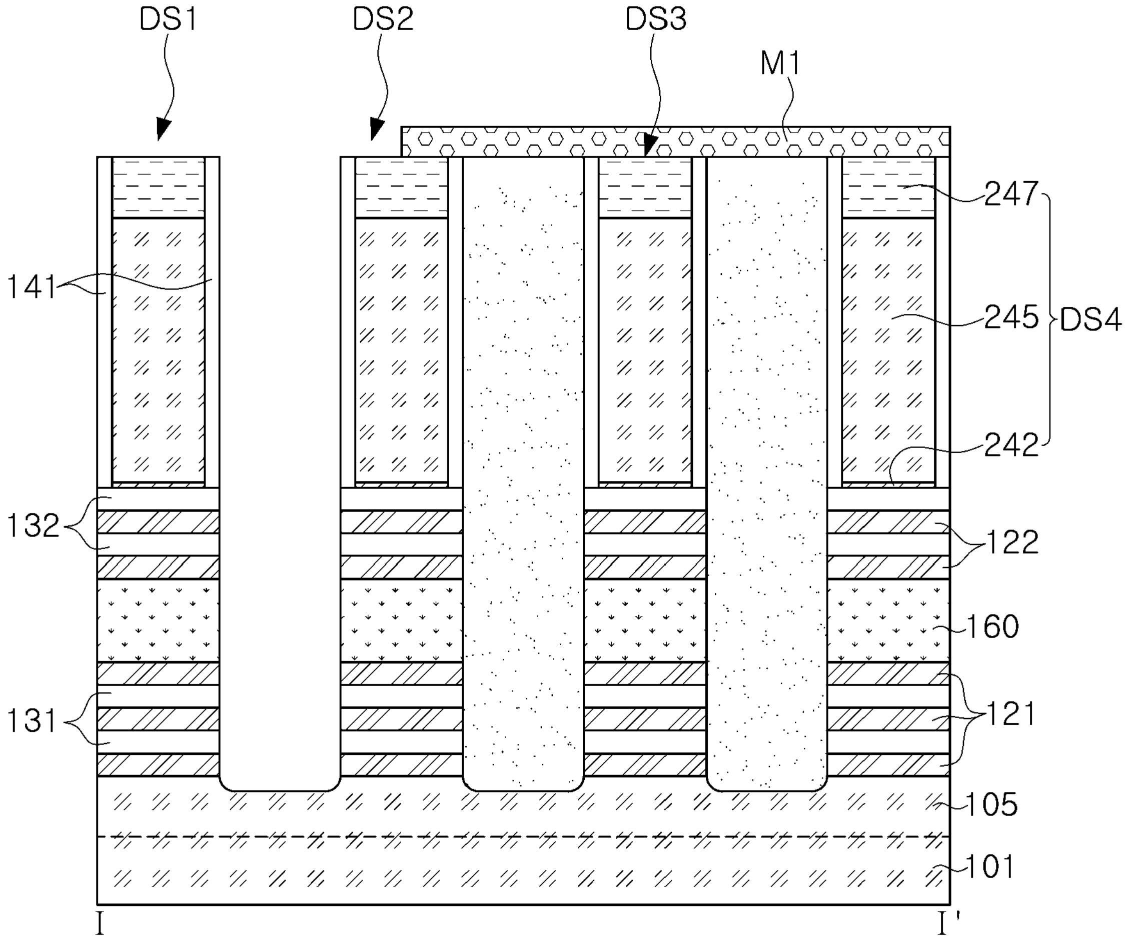

Referring to FIG. 12D, the first gap-fill insulating layer 275*a* may be selectively removed from a space between the first and second dummy gate structures DS1 and DS2.

A photomask M1 may be formed to cover a portion of the first gap-fill insulating layers 275*b* and 275*c* from the upper surface of the second dummy gate structure DS2 to the upper surface of the fourth dummy gate structure DS4, and the first gap-fill insulating layer 275*a* between the first and second dummy gate structures DS1 and DS2 may be selectively removed.

Figure 12E:
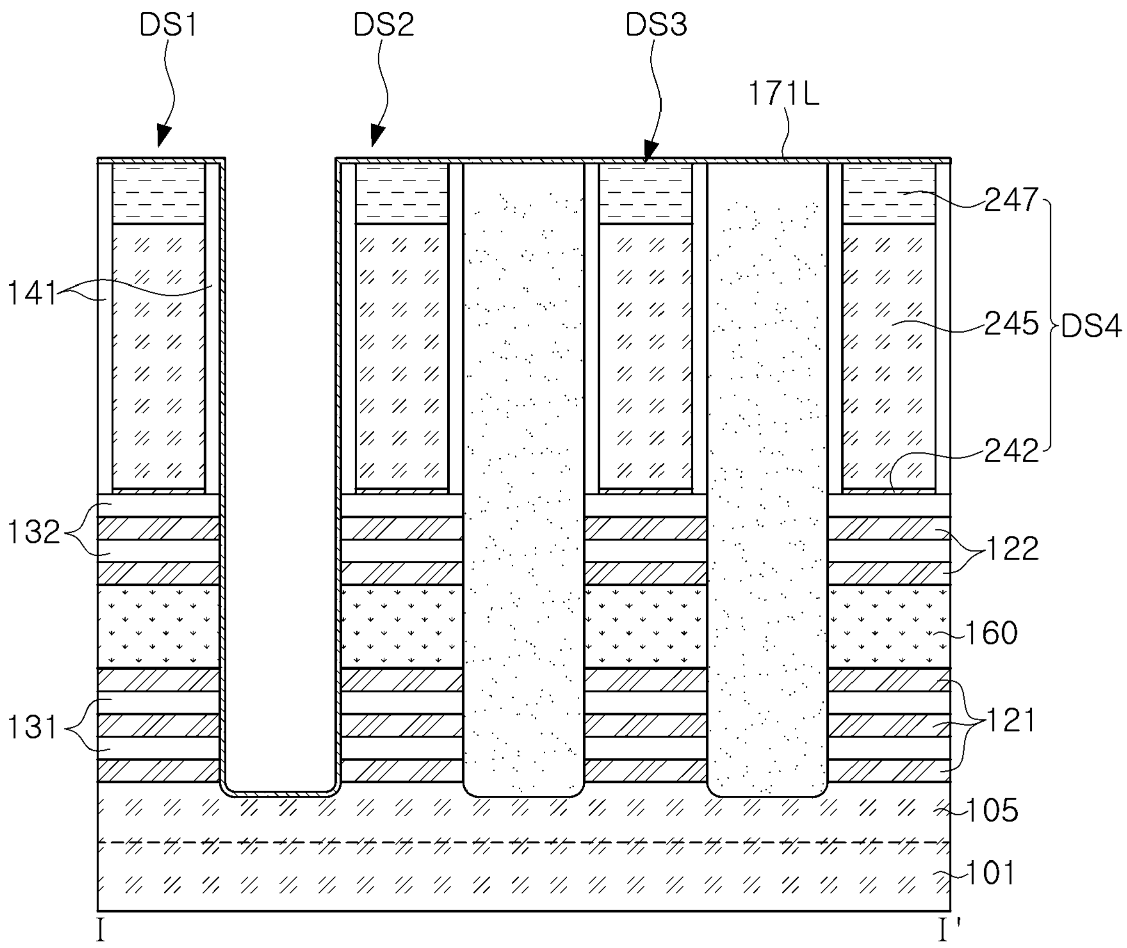

Referring to FIG. 12E, the photo mask M1 may be removed, and a liner material layer 171L may be formed. The liner material layer 171L may be conformally formed with the surface of the first recess region RS1 between the first and second dummy gate structures DS1 and DS2, the upper surfaces of the first to fourth dummy gate structures DS2, DS3, and DS4 and the upper surfaces of the first gap-fill material layers 275*b* and 275*c*. For example, the liner material layer 171L may include silicon nitride, silicon oxynitride, or silicon carbonitride.

Figure 12F:
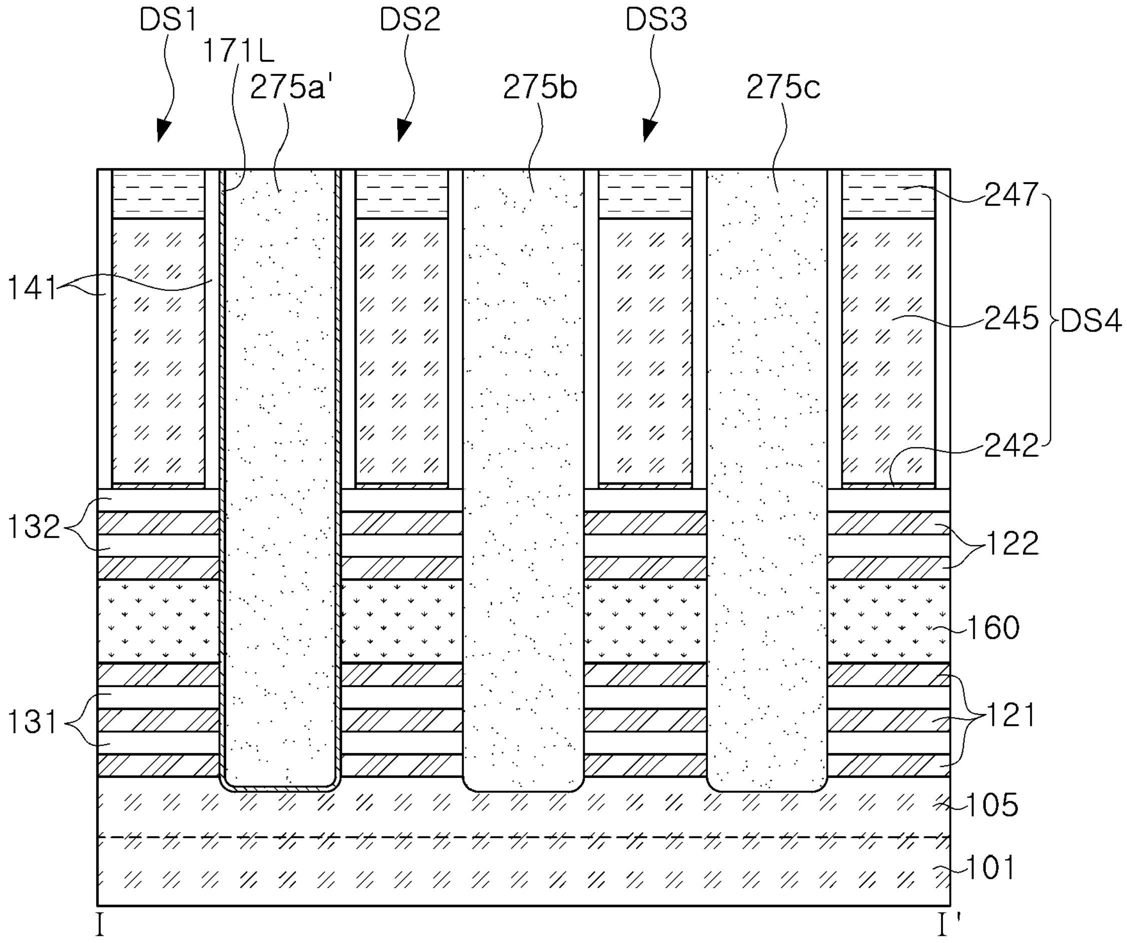

Referring to FIG. 12F, a second insulating material layer may be formed to fill the space between the first and second dummy gate structures DS1 and DS2, and the second gap-fill insulating layer 275*a*' may be formed by applying a planarization process such as CMP.

Through the planarization process, a liner material layer 171L and a second insulating material layer disposed on the upper surfaces of the first to fourth dummy gate structures DS2, DS3, and DS4 and the upper surfaces of the first gap-fill material layers 275*b* and 275*c* may be removed. The first gap-fill insulating layers 275*a*, 275*b*, and 275*c* may be silicon oxide such as SOH.

A second gap-fill insulating layer 275*a*' may be disposed together with the liner material layer 171L in a space between the first and second dummy gate structures DS1 and DS2, whereas only the first gap-fill material layers 275*b* and 275*c* may be disposed in a space between the dummy gate structures DS2 and DS3 and between the third and fourth dummy gate structures DS3 and DS4 without the liner material layer 171L.

Figure 12G:
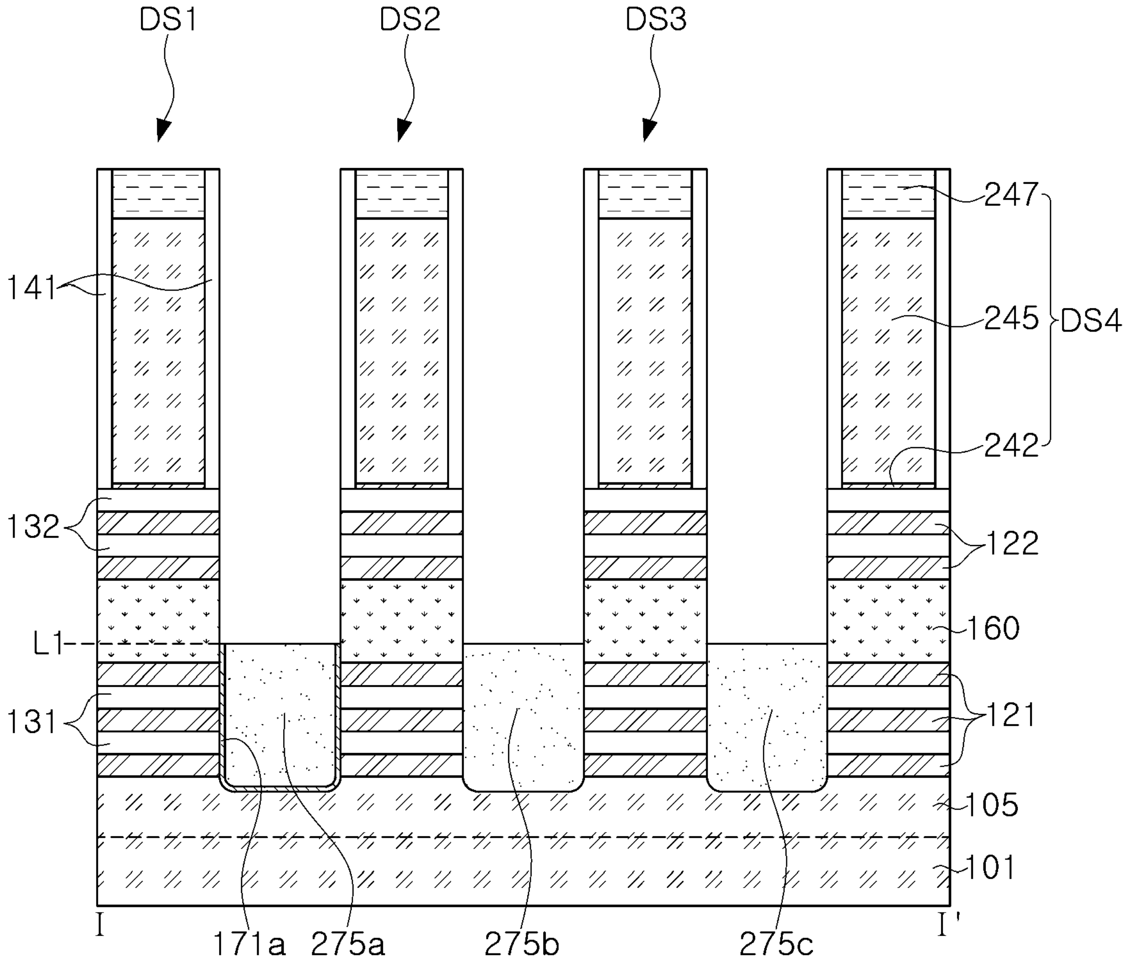

Referring to FIG. 12G, the first gap-fill insulating layers 275*b* and 275*c* and the second gap-fill insulating layer 275*a*' may be recessed, and a portion of the liner material layer 171L exposed between the first and second dummy gate structures DS1 and DS2 may be removed.

The first gap-fill insulating layers 275*b* and 275*c* and the second gap-fill insulating layer 275*a*' may have a lower level, a first level L1, by applying a recess process such as an etch-back. After the second gap-fill insulating layer 275*a*' is recessed, the exposed portion of the liner material layer 171L may be removed using a selective etching process. Accordingly, the first insulating liner 171*a* defined as the first level L1 of the recessed second gap-fill insulating layer 275*a*' may be formed.

The first insulating liner 171*a* may be provided as a blocking layer for preventing epitaxial growth between the first and second dummy gate structures DS1 and DS2 in the process (FIG. 12J) of forming the first source/drain region. The first level L1 may have a level higher than that of at least the upper surface of the uppermost first channel layer 131. In example embodiments, the first level L1 may have a level corresponding to a level of a source/drain region to be formed later.

Figure 12H:
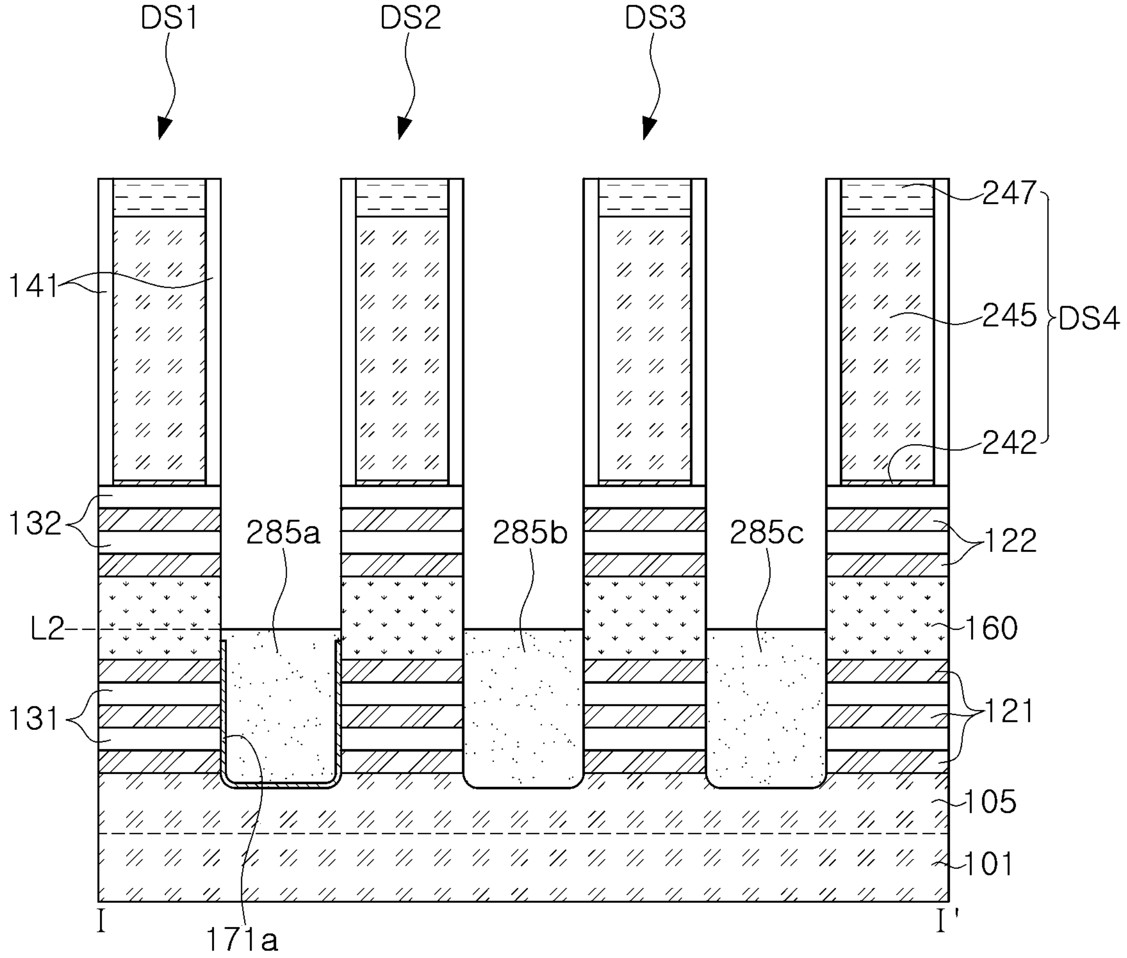

Referring to FIG. 12H, third gap-fill insulating layers 285*a*, 285*b*, and 285*c* may be formed by removing the first gap-fill insulating layers 275*b* and 275*c* and the second gap-fill insulating layer 275*a*', forming a third insulating material layer, and applying a recess process. For example, the third insulating material layer may be silicon oxide such as SOH. The third gap-fill insulating layers 285*a*, 285*b*, and 285*c* may be formed on a second level L2 higher than the first level L1. Also, the third gap-fill insulating layer 285 disposed between the first and second dummy gate structures DS1 and DS2 may be formed to cover the first insulating liner 171*a*. Accordingly, in the process of forming the upper blocking insulating layer 291 (see FIG. 121I), the first insulating liner 171*a* may be protected.

Figure 12I:
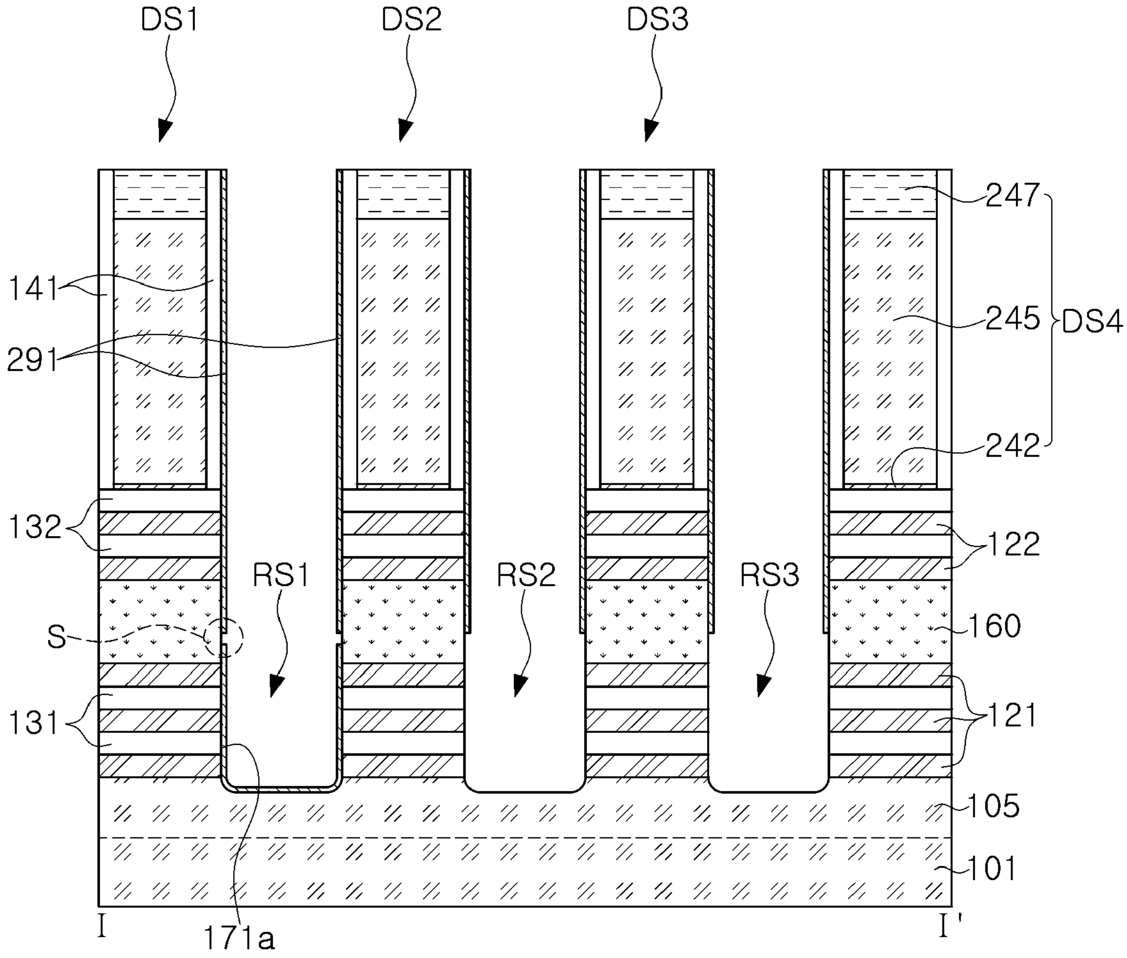

Referring to FIG. 12I, upper blocking insulating layer 291 may be formed to cover side surfaces of the second channel layers 132 exposed in spaces between the first to fourth dummy gate structures DS1, DS2, DS3, and DS4.

After the previous process, that is, the process of forming the third gap-fill insulating layers 285*a*, 285*b*, and 285*c* (see FIG. 12H), a blocking material layer may be conformally formed on the entire surface. For example, the blocking material layer may include silicon nitride, silicon oxynitride, or silicon carbonitride. A desired upper blocking insulating layer 291 may be formed on side surfaces of spaces between the first to fourth dummy gate structures DS1, DS2, DS3, and DS4 by selectively removing the blocking material layer through an anisotropic etching process. Subsequently, the structure illustrated in FIG. 12I may be obtained by selectively removing the third gap-fill insulating layers 285*a*, 285*b*, and 285*c*. As illustrated in FIG. 12I, the side surfaces of the second and third recess regions RS2 and RS3 and the first channel layers 131 adjacent thereto may be open, whereas side surfaces of the first recess region RS1 and the first channel layers 131 adjacent thereto may be covered by the first insulating liner 171*a*. In a subsequent process of forming the first source/drain region 150A, the first insulating liner 171*a* may act as an epitaxial prevention layer.

A lower end of the upper blocking insulating layer 291 may be disposed to overlap a side surface of the intermediate insulating layer 160 in a horizontal direction. In the example embodiment, the lower level of the upper blocking insulating layer 291 may be defined by the upper surface level L2 of the third gap-fill insulating layers 285*a*, 285*b*, and 285*c*, and accordingly, in the first recess region, an upper end of the first insulating liner 171*a* may be spaced apart from a lower end of the upper blocking insulating layer 291 with a predetermined distance S therebetween.

Figure 12J:
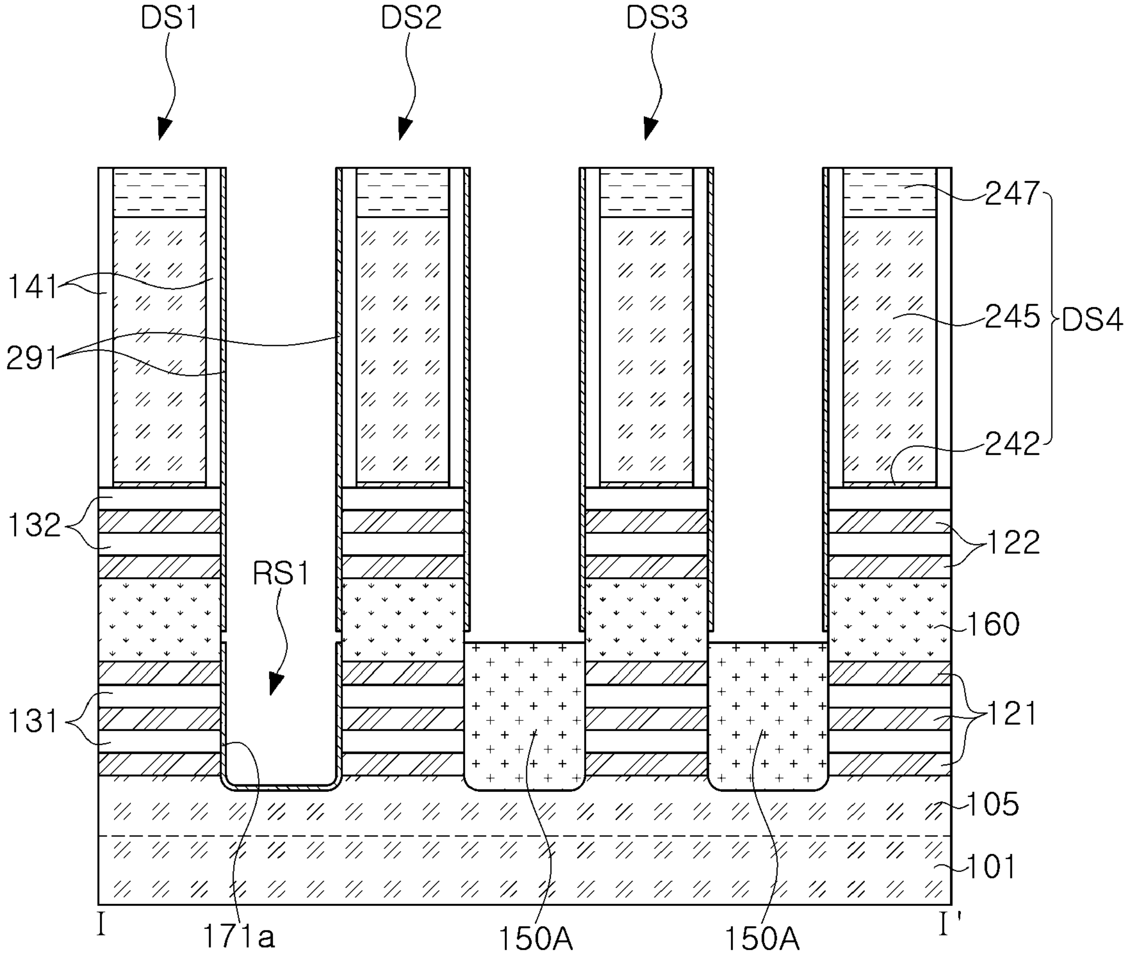

Referring to FIG. 12J, a process of forming the first source/drain region 150A may be performed.

Desired first source/drain regions 150A may be formed by growing epitaxial growth from the side surfaces of the second and third recess regions RS2 and RS3 and the first channel layers 131 adjacent thereto. The side surfaces of the first recess region RS1 and the first channel layers 131 adjacent thereto between the first and second dummy gate structures DS1 and DS2 may be covered by the first insulating liner 171*a*, such that epitaxial layer growth may be prevented. Similarly, in the process of forming the first source/drain region 150A, epitaxial growth on the side surfaces of the second channel layers may be prevented by the upper blocking insulating layer 291.

Figure 12K:
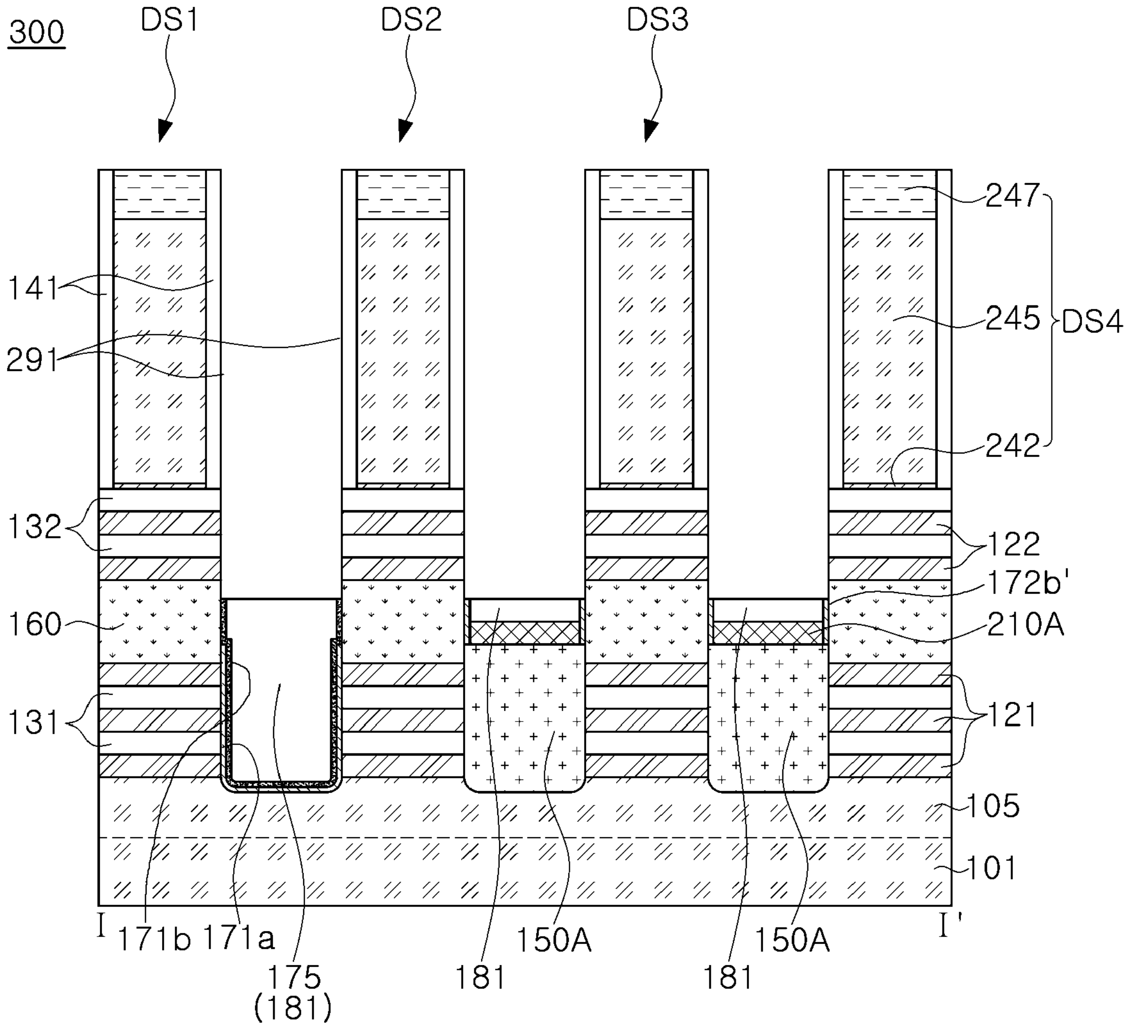

Referring to FIG. 12K, after forming the lower contact 210 on the first source/drain regions 150A, a first interlayer insulating layer 181 may be formed to cover the first transistor structure.

Before forming the lower contact 210, a process of forming the insulating barrier 171*b*' may be performed. The barrier material layer may be formed on the entire surface, a contact region may be formed by applying anisotropic etching to expose the upper surface of the first source/drain region 150A, and the lower contact 210 and the first interlayer insulating layer 181 may be formed. In this process, a second insulating liner 171*b* may be formed of the same material as that of the insulating barrier 171*b* on the first insulating liner 171*a* in the first recess region RS1. Thereafter, in the process of forming the first interlayer insulating layer 181, an insulating gap-fill portion 175 filling the space of the first recess region RS1 may be formed. As such, in the example embodiment, the blocking structure 170 including the insulating gap-fill portion 175 may be formed together with the first and second insulating liners 171*a* and 171*b*.

Thereafter, the upper blocking insulating layer 291 may be removed (see FIG. 12K), second source/drain regions 150B may be formed, and a second interlayer insulating layer 182 may be formed. Subsequently, the first to fourth dummy gate structures DS1, DS2, DS3, and DS4 may be removed, and the process of forming the gate insulating layer 142, the gate electrode 145, and the gate capping layer 147 may be performed, such that the semiconductor device 300 illustrated in FIG. 11 may be manufactured.

The blocking structure 170 may be modified to a variety of other structures. For example, the blocking structure 170 may be modified to the structure in FIGS. 5, 7, and 8, and may be implemented by modifying the above-described manufacturing method.

FIGS. 14A to 14E are cross-sectional diagrams illustrating a semiconductor device according to example embodiments, illustrating a method of manufacturing a semiconductor device having the gap-fill-type blocking structure 170A described in FIG. 5. Here, FIG. 14A may be understood as a process performed after the process in FIG. 12D in the aforementioned manufacturing process.

Referring to FIG. 14A, a blocking structure 170A including an insulating gap-fill portion may be selectively formed in a space between the first and second dummy gate structures DS1 and DS2.

An insulating gap-fill material may be formed to fill a region between the first and second dummy gate structures DS1 and DS2 using a photo mask M1 covering portions of the first gap-fill insulating layers 275*b* and 275*c*, and the level of the insulating gap-fill material may be adjusted by applying a recess process, thereby forming the blocking structure. For example, the insulative gap-fill material may include silicon nitride, silicon oxynitride, or silicon carbonitride.

Referring to FIG. 14B, second gap-fill insulating layers 285*a*', 285*b*', and 285*c*' may be formed by removing the photo mask M1, removing the first gap-fill insulating layers 275*b* and 275*c*, forming an additional insulating material layer, and applying a recess process. For example, the second insulating material layer may be silicon oxide such as SOH. The second gap-fill insulating layers 285*a*', 285*b*', and 285*c*' may have an upper surface level higher than an upper surface level of the blocking structure 170A. Also, the blocking structure 170A disposed between the first and second dummy gate structures DS1 and DS2 may be covered by a second gap-fill insulating layer 285*a*'.

Thereafter, referring to FIG. 14C, an upper blocking insulating layer 291 may be formed to the side surfaces of the second channel layers 132 exposed in spaces between the first to fourth dummy gate structures DS1, DS2, DS3, and DS4, and the second gap-fill insulating layers 285*a*', 285*b*', and 285*c*' may be removed.

After the previous process, that is, the process of forming the second gap-fill insulating layers 285*a*', 285*b*', and 285*c*', a blocking material layer may be conformally formed on the entire surface. For example, the blocking material layer may include silicon nitride, silicon oxynitride, or silicon carbonitride. A desired upper blocking insulating layer 291 may be formed on side surfaces of spaces between the first to fourth dummy gate structures DS1, DS2, DS3, and DS4 by selectively removing the blocking material layer through an anisotropic etching process. Subsequently, the second gap-fill insulating layers 285*a*', 285*b*', and 285*c*' may be selectively removed. As illustrated in FIG. 14C, while the side surfaces of the second and third recess regions RS2 and RS3 and the first channel layers 131 adjacent thereto may be open, side surfaces of the first recess region RS1 and the first channel layers 131 adjacent thereto may be covered by the blocking structure 170A. In a subsequent process of forming the first source/drain region 150A, the blocking structure 170A may act as an epitaxial prevention layer. Similarly to the aforementioned example embodiment, in the first recess region RS1, the upper surface of the blocking structure 170A may be spaced apart from the lower end of the upper blocking insulating layer 291 with a predetermined distance S therebetween.

Referring to FIG. 14D, a process of forming the first source/drain region 150A may be performed.

Desired first source/drain regions 150A may be formed through epitaxial growth from the side surfaces of the second and third recess regions RS2 and RS3 and the first channel layers 131 adjacent thereto. Since the side surfaces of the first recess region RS1 and the first channel layers 131 adjacent thereto are covered by the blocking structure 170A between the first and second dummy gate structures DS1 and DS2, epitaxial layer growth may be prevented. Similarly, in the process of forming the first source/drain region 150A, epitaxial growth on the side surfaces of the second channel layers may be prevented by the upper blocking insulating layer 291.

Thereafter, lower contacts 210 may be formed on the first source/drain regions 150A, and a first interlayer insulating layer 181 may be formed to cover the first transistor structure. Thereafter, the upper blocking insulating layer 291 may be removed, second source/drain regions 150B may be formed, and a second interlayer insulating layer 182 may be formed. Subsequently, the first to fourth dummy gate structures DS1, DS2, DS3, and DS4 may be removed and a process of forming the gate insulating layer 142, the gate electrode 145, and the gate capping layer 147 may be performed, such that the semiconductor device 300A illustrated in FIG. 14E may be manufactured.

According to the aforementioned example embodiments, in a semiconductor device in which MOSFETs are stacked, by forming a blocking structure preventing epitaxial growth in a portion of the regions in which the source/drain region is or would otherwise be formed, the source/drain region may be selectively omitted. Also, when a MOSFET disposed on the upper level (e.g., N-type MOSFET) is used as an access transistor in SRAM, to prevent the source/drain region of the lower level MOSFET (e.g. P-type MOSFET) from being provided as a floating epitaxial, epitaxial growth may be selectively blocked using a blocking structure in the region.

While the example embodiments have been illustrated and described above, it will be configured as apparent to those skilled in the art that modifications and variations could be made without departing from the scope of the present disclosure as defined by the appended claims.

What is claimed is:

1. A semiconductor device, comprising:
an active pattern extending in a first direction on a substrate;
a plurality of channel layers spaced apart from each other on the active pattern in a direction perpendicular to an upper surface of the substrate and including lower channel layers and upper channel layers on the lower channel layers;
an intermediate insulating layer between an uppermost lower channel layer among the lower channel layers and a lowermost upper channel layer among the upper channel layers;
a gate structure intersecting the active pattern, extending in a second direction intersecting the first direction, and on the plurality of channel layers;
a lower source/drain region on a first side of the gate structure and connected to the lower channel layers;
a blocking structure on a second side of the gate structure and connected to the lower channel layers; and
an upper source/drain region on at least the second side of the gate structure and connected to the upper channel layers disposed above the blocking structure.

2. The semiconductor device of claim 1, wherein the blocking structure comprises:
an insulating liner extending from a portion of the active pattern on the second side of the gate structure along side surfaces of the lower channel layers; and
an insulating gap-fill portion on the insulating liner.

3. The semiconductor device of claim 2, wherein the insulating liner has a lower region having a first thickness and an upper region having a second thickness that is smaller than the first thickness.

4. The semiconductor device of claim 2, wherein the insulating liner comprises silicon nitride, silicon oxynitride, or silicon carbonitride, and the insulating gap-fill portion comprises silicon oxide.

5. The semiconductor device of claim 1, wherein the blocking structure is on a portion of the active pattern on the second side of the gate structure and comprises an insulating gap-fill portion connected to side surfaces of the lower channel layers.

6. The semiconductor device of claim 5, wherein the insulating gap-fill portion comprises silicon nitride, silicon oxynitride, or silicon carbonitride.

7. The semiconductor device of claim 1,
wherein the upper source/drain region is connected to the upper channel layers on the first side of the gate structure, and
wherein the blocking structure extends to the upper channel layers on the second side of the gate structure.

8. The semiconductor device of claim 1,
wherein the semiconductor device further comprises a first interlayer insulating layer on the lower source/drain region and the blocking structure, and a second interlayer insulating layer between the first interlayer insulating layer and the upper source/drain region, and
wherein portions of each of the first and second interlayer insulating layer separate the upper source/drain region from the lower source/drain region and the blocking structure.

9. The semiconductor device of claim 1, further comprising:
a lower contact connected to the lower source/drain region, and an upper contact connected to the upper source/drain region.

10. The semiconductor device of claim 9, wherein the lower contact comprises a first horizontal contact portion connected to the lower source/drain region and extending in a horizontal direction parallel to the upper surface of the substrate, and a first vertical contact portion connected to the first horizontal contact portion and extending in the direction perpendicular to the upper surface of the substrate.

11. The semiconductor device of claim 10, further comprising:
a first buried electrode in the substrate,
wherein the first vertical contact portion extends toward the substrate and is connected to the first buried electrode.

12. The semiconductor device of claim 9, further comprising:
a second buried electrode buried in the substrate,
wherein the upper contact comprises a second horizontal contact portion connected to the upper source/drain region and extending in a horizontal direction parallel to the upper surface of the substrate, and a second vertical contact portion connecting the second horizontal contact portion to the second buried electrode.

13. A semiconductor device, comprising:
an active pattern extending in a first direction on a substrate;
first lower channel layers on a first region of the active pattern and spaced apart from each other in a direction perpendicular to an upper surface of the substrate;
second lower channel layers on a second region of the active pattern and spaced apart from each other in the direction perpendicular to the upper surface of the substrate;
third lower channel layers on a third region of the active pattern and spaced apart from each other in the direction perpendicular to the upper surface of the substrate;
first, second, and third intermediate insulating layers on uppermost lower channel layers of the first, second, and third lower channel layers, respectively;
first, second, and third upper channel layers stacked and spaced apart from each other on the first, second, and third intermediate insulating layers, respectively;
a first gate structure intersecting the first region of the active pattern, extending in a second direction intersecting the first direction and on the first lower channel layers and the first upper channel layers;
a second gate structure intersecting the second region of the active pattern, extending in the second direction and on the second lower channel layers and the second upper channel layers;
a third gate structure intersecting the third region of the active pattern, extending in the second direction and on the third lower channel layers and the third upper channel layers;
a first lower source/drain region between the first and second gate structures and connected to the first and second lower channel layers;
a first upper source/drain region between the first and second gate structures and connected to the first and second upper channel layers; and
a blocking structure between the second and third gate structures, wherein the blocking structure is between the second and third lower channel layers and/or is between the second and third upper channel layers, wherein the blocking structure comprises a lower blocking structure between the second and third lower channel layers, and wherein the semiconductor device further comprises a second upper source/drain region connected to the second and third upper channel layers between the second and third gate structures.

14. The semiconductor device of claim 13, further comprising:

a first interlayer insulating layer on the first lower source/drain region and the blocking structure, and a second interlayer insulating layer on the first interlayer insulating layer and on the first and second upper source/drain regions, and wherein portions of the first and second interlayer insulating layers separate the first and second upper source/drain regions from the first lower source/drain region and the blocking structure, respectively.

15. The semiconductor device of claim 13, wherein the blocking structure comprises an upper blocking structure between the second and third upper channel layers, and wherein the semiconductor device further comprises a second lower source/drain region connected to the second and third lower channel layers between the second and third gate structures.

16. The semiconductor device of claim 13, wherein the blocking structure extends from between the second and third lower channel layers to between the second and third upper channel layers.

17. A semiconductor device, comprising:

a first transistor structure on a substrate; and a second transistor structure on the first transistor structure, wherein the first transistor structure comprises:

first channel layers stacked and spaced apart from each other on the substrate in a vertical direction perpendicular to an upper surface of the substrate;

a first gate electrode on the first channel layers;

a first source/drain region on a first side of the first gate electrode and connected to first side surfaces of the first channel layers;

a blocking structure on the first channel layers on a second side of the first gate electrode;

a third source/drain region disposed on the second side of the gate structure and connecter to the first channel layers disposed above the blocking structure, wherein the second transistor structure comprises:

second channel layers on the first channel layers and stacked and spaced apart from each other in the vertical direction;

a second gate electrode on the second channel layers;

first and second upper source/drain regions on first and second sides of the second gate electrode and connected to opposing side surfaces of the second channel layers, respectively.

18. The semiconductor device of claim 17, wherein the blocking structure comprises an insulating liner extending from an upper surface portion of the substrate on the second side of the first gate electrode along side surfaces of the first channel layers, and an insulating gap-fill portion on the insulating liner, and wherein the insulating liner comprises silicon nitride, silicon oxynitride, or silicon carbonitride, and the insulating gap-fill portion comprises silicon oxide.

19. The semiconductor device of claim 17, wherein the blocking structure comprises:

an insulating gap-fill portion on an upper surface portion of the substrate on the second side of the first gate electrode and connected to second side surfaces of the first channel layers, wherein the insulating gap-fill portion comprises silicon nitride, silicon oxynitride, or silicon carbonitride.

* * * * *